(12) United States Patent
Ahn et al.

(10) Patent No.: US 8,125,038 B2
(45) Date of Patent: Feb. 28, 2012

(54) NANOLAMINATES OF HAFNIUM OXIDE AND ZIRCONIUM OXIDE

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 676 days.

(21) Appl. No.: 11/178,914

(22) Filed: Jul. 11, 2005

(65) Prior Publication Data
US 2005/0277256 A1    Dec. 15, 2005

Related U.S. Application Data

(62) Division of application No. 10/209,581, filed on Jul. 30, 2002, now Pat. No. 6,921,702.

(51) Int. Cl.
H01L 29/78    (2006.01)
(52) U.S. Cl. ................................. 257/411; 257/E29.132
(58) Field of Classification Search .................. 257/410, 257/411, E29.132
See application file for complete search history.

(56) References Cited

U.S. PATENT DOCUMENTS

| | | | |
|---|---|---|---|
| 2,501,563 A | 3/1950 | Colbert et al. |
| 3,381,114 A | 4/1968 | Nakanuma |
| 4,058,430 A | 11/1977 | Suntola et al. |
| 4,215,156 A | 7/1980 | Dalal et al. |
| 4,333,808 A | 6/1982 | Bhattacharyya et al. |
| 4,399,424 A | 8/1983 | Rigby |
| 4,413,022 A | 11/1983 | Suntola et al. |
| 4,590,042 A | 5/1986 | Drage |
| 4,608,215 A | 8/1986 | Gonczy et al. |
| 4,645,622 A | 2/1987 | Kock |
| 4,647,947 A | 3/1987 | Takeoka et al. |
| 4,767,641 A | 8/1988 | Kieser et al. |
| 4,920,071 A | 4/1990 | Thomas |
| 4,993,358 A | 2/1991 | Mahawili |
| 5,006,192 A | 4/1991 | Deguchi |
| 5,055,319 A | 10/1991 | Bunshah et al. |
| 5,302,461 A | 4/1994 | Anthony |
| 5,572,052 A | 11/1996 | Kashihara et al. |
| 5,587,609 A | 12/1996 | Murakami et al. |
| 5,595,606 A | 1/1997 | Fujikawa et al. |
| 5,625,233 A | 4/1997 | Cabral, Jr. et al. |
| 5,674,563 A | 10/1997 | Tarui et al. |
| 5,698,022 A | 12/1997 | Glassman et al. |
| 5,735,960 A | 4/1998 | Sandhu et al. |

(Continued)

FOREIGN PATENT DOCUMENTS
EP    0540993 A1    5/1993
(Continued)

OTHER PUBLICATIONS

Wilk et al., "High-k gate dielectrics: Current status and materials properties considerations", Journal of Applied Physics, vol. 89, No. 10, May 2001, pp. 5243-5275.*

(Continued)

*Primary Examiner* — Evan Pert
(74) *Attorney, Agent, or Firm* — Schwegman, Lundberg & Woessner, P.A.

(57) ABSTRACT

A dielectric film containing a $HfO_2/ZrO_2$ nanolaminate and a method of fabricating such a dielectric film produce a reliable dielectric layer having an equivalent oxide thickness thinner than attainable using $SiO_2$. A dielectric layer containing a $HfO_2/ZrO_2$ nanolaminate may be realized in a wide variety of electronic devices and systems.

33 Claims, 14 Drawing Sheets

U.S. PATENT DOCUMENTS

| | | | |
|---|---|---|---|
| 5,765,214 A | 6/1998 | Sywyk | |
| 5,795,808 A | 8/1998 | Park | |
| 5,801,105 A | 9/1998 | Yano et al. | |
| 5,810,923 A | 9/1998 | Yano et al. | |
| 5,822,256 A | 10/1998 | Bauer et al. | |
| 5,828,080 A | 10/1998 | Yano et al. | |
| 5,840,897 A | 11/1998 | Kirlin et al. | |
| 5,912,797 A | 6/1999 | Schneemeyer et al. | |
| 5,916,365 A | 6/1999 | Sherman | |
| 5,950,925 A | 9/1999 | Fukunaga et al. | |
| 5,998,264 A | 12/1999 | Wu | |
| 6,013,553 A | 1/2000 | Wallace et al. | |
| 6,020,024 A | 2/2000 | Maiti et al. | |
| 6,020,243 A | 2/2000 | Wallace et al. | |
| 6,025,627 A | 2/2000 | Forbes et al. | |
| 6,027,961 A | 2/2000 | Maiti et al. | |
| 6,057,271 A | 5/2000 | Kenjiro et al. | |
| 6,059,885 A | 5/2000 | Ohashi et al. | |
| 6,060,743 A | 5/2000 | Sugiyama et al. | |
| 6,093,944 A | 7/2000 | VanDover | |
| 6,110,529 A | 8/2000 | Gardiner et al. | |
| 6,146,976 A | 11/2000 | Stecher et al. | |
| 6,161,500 A | 12/2000 | Kopacz et al. | |
| 6,171,900 B1 | 1/2001 | Sun | |
| 6,200,893 B1 | 3/2001 | Sneh | |
| 6,203,613 B1 | 3/2001 | Gates et al. | |
| 6,206,972 B1 | 3/2001 | Dunham | |
| 6,207,589 B1 | 3/2001 | Ma et al. | |
| 6,211,035 B1 | 4/2001 | Moise et al. | |
| 6,225,168 B1 | 5/2001 | Gardner et al. | |
| 6,281,144 B1 | 8/2001 | Cleary et al. | |
| 6,291,866 B1 | 9/2001 | Wallace et al. | |
| 6,294,813 B1 | 9/2001 | Forbes et al. | |
| 6,297,539 B1 | 10/2001 | Ma et al. | |
| 6,300,203 B1 | 10/2001 | Buynoski et al. | |
| 6,302,964 B1 | 10/2001 | Umotoy et al. | |
| 6,303,481 B2 | 10/2001 | Park | |
| 6,348,386 B1 | 2/2002 | Gilmer | |
| 6,352,591 B1 | 3/2002 | Yieh et al. | |
| 6,368,941 B1 | 4/2002 | Chen et al. | |
| 6,380,579 B1 | 4/2002 | Nam et al. | |
| 6,387,712 B1 | 5/2002 | Yano et al. | |
| 6,391,769 B1 | 5/2002 | Lee et al. | |
| 6,417,537 B1 | 7/2002 | Yang et al. | |
| 6,420,279 B1 | 7/2002 | Ono et al. | |
| 6,423,613 B1 | 7/2002 | Geusic | |
| 6,432,779 B1 | 8/2002 | Hobbs et al. | |
| 6,441,417 B1 | 8/2002 | Zhang et al. | |
| 6,444,039 B1 | 9/2002 | Nguyen | |
| 6,444,592 B1 | 9/2002 | Ballantine et al. | |
| 6,445,023 B1 | 9/2002 | Vaartstra et al. | |
| 6,448,192 B1 | 9/2002 | Kaushik | |
| 6,451,641 B1 | 9/2002 | Halliyal et al. | |
| 6,451,695 B2 | 9/2002 | Sneh | |
| 6,455,330 B1 | 9/2002 | Yao et al. | |
| 6,458,701 B1 | 10/2002 | Chae et al. | |
| 6,465,334 B1 | 10/2002 | Buynoski et al. | |
| 6,482,740 B2 | 11/2002 | Soininen et al. | |
| 6,495,436 B2 | 12/2002 | Ahn et al. | |
| 6,495,437 B1 | 12/2002 | Yu | |
| 6,509,280 B2 | 1/2003 | Choi | |
| 6,514,828 B2 | 2/2003 | Ahn et al. | |
| 6,521,911 B2 | 2/2003 | Parsons et al. | |
| 6,527,866 B1 | 3/2003 | Matijasevic et al. | |
| 6,528,858 B1 | 3/2003 | Yu et al. | |
| 6,534,420 B2 | 3/2003 | Ahn et al. | |
| 6,537,613 B1 | 3/2003 | Senzaki et al. | |
| 6,541,079 B1 | 4/2003 | Bojarczuk, Jr. et al. | |
| 6,541,353 B1 | 4/2003 | Sandhu et al. | |
| 6,542,229 B1 | 4/2003 | Kalal et al. | |
| 6,544,875 B1 | 4/2003 | Wilk | |
| 6,551,893 B1 | 4/2003 | Zheng et al. | |
| 6,551,929 B1 | 4/2003 | Kori et al. | |
| 6,552,388 B2 | 4/2003 | Wilk et al. | |
| 6,559,014 B1 | 5/2003 | Jeon | |
| 6,559,472 B2 | 5/2003 | Sandhu et al. | |
| 6,562,491 B1 * | 5/2003 | Jeon | 428/697 |
| 6,586,349 B1 | 7/2003 | Jeon et al. | |
| 6,586,792 B2 | 7/2003 | Ahn et al. | |
| 6,590,252 B2 | 7/2003 | Kutsunai et al. | |
| 6,592,942 B1 | 7/2003 | Van Wijck | |
| 6,596,636 B2 | 7/2003 | Sandhu et al. | |
| 6,608,378 B2 | 8/2003 | Ahn et al. | |
| 6,613,656 B2 | 9/2003 | Li | |
| 6,613,702 B2 | 9/2003 | Sandhu et al. | |
| 6,617,639 B1 | 9/2003 | Wang et al. | |
| 6,627,260 B2 | 9/2003 | Derderian et al. | |
| 6,627,503 B2 | 9/2003 | Ma et al. | |
| 6,630,713 B2 | 10/2003 | Geusic | |
| 6,632,279 B1 | 10/2003 | Ritala et al. | |
| 6,638,810 B2 | 10/2003 | Bakli et al. | |
| 6,638,859 B2 | 10/2003 | Sneh et al. | |
| 6,645,882 B1 | 11/2003 | Halliyal et al. | |
| 6,652,924 B2 | 11/2003 | Sherman | |
| 6,656,764 B1 * | 12/2003 | Wang et al. | 438/104 |
| 6,660,660 B2 | 12/2003 | Haukka et al. | |
| 6,661,058 B2 | 12/2003 | Ahn et al. | |
| 6,673,701 B1 | 1/2004 | Marsh et al. | |
| 6,674,138 B1 | 1/2004 | Halliyal et al. | |
| 6,683,005 B2 | 1/2004 | Sandhu et al. | |
| 6,683,011 B2 | 1/2004 | Smith et al. | |
| 6,696,332 B2 | 2/2004 | Visokay et al. | |
| 6,699,747 B2 | 3/2004 | Ruff et al. | |
| 6,709,989 B2 | 3/2004 | Ramdani et al. | |
| 6,713,846 B1 | 3/2004 | Senzaki | |
| 6,730,575 B2 | 5/2004 | Eldridge | |
| 6,740,605 B1 | 5/2004 | Shiraiwa et al. | |
| 6,746,930 B2 | 6/2004 | Yang et al. | |
| 6,750,066 B1 | 6/2004 | Cheung et al. | |
| 6,754,108 B2 | 6/2004 | Forbes | |
| 6,767,582 B1 | 7/2004 | Elers | |
| 6,767,795 B2 | 7/2004 | Ahn et al. | |
| 6,777,353 B2 | 8/2004 | Putkonen | |
| 6,778,441 B2 | 8/2004 | Forbes et al. | |
| 6,780,704 B1 | 8/2004 | Raaijmakers et al. | |
| 6,787,370 B2 | 9/2004 | Forbes et al. | |
| 6,787,413 B2 | 9/2004 | Ahn | |
| 6,790,791 B2 | 9/2004 | Ahn et al. | |
| 6,804,136 B2 | 10/2004 | Forbes | |
| 6,806,211 B2 | 10/2004 | Shinriki et al. | |
| 6,812,100 B2 | 11/2004 | Ahn et al. | |
| 6,821,862 B2 | 11/2004 | Cho | |
| 6,821,873 B2 | 11/2004 | Visokay et al. | |
| 6,831,315 B2 | 12/2004 | Raaijmakers et al. | |
| 6,844,203 B2 | 1/2005 | Ahn et al. | |
| 6,844,604 B2 | 1/2005 | Lee et al. | |
| 6,852,167 B2 | 2/2005 | Ahn | |
| 6,858,444 B2 | 2/2005 | Ahn et al. | |
| 6,884,739 B2 | 4/2005 | Ahn et al. | |
| 6,888,739 B2 | 5/2005 | Forbes | |
| 6,893,984 B2 | 5/2005 | Ahn et al. | |
| 6,900,122 B2 | 5/2005 | Ahn et al. | |
| 6,914,800 B2 | 7/2005 | Ahn et al. | |
| 6,930,346 B2 | 8/2005 | Ahn et al. | |
| 6,958,302 B2 | 10/2005 | Ahn et al. | |
| 6,984,591 B1 | 1/2006 | Buchanan et al. | |
| 7,012,311 B2 | 3/2006 | Ohmi et al. | |
| 7,169,673 B2 | 1/2007 | Ahn et al. | |
| 7,235,501 B2 | 6/2007 | Ahn et al. | |
| 7,365,027 B2 | 4/2008 | Ahn et al. | |
| 7,388,246 B2 | 6/2008 | Ahn et al. | |
| 7,390,756 B2 | 6/2008 | Ahn et al. | |
| 7,399,666 B2 | 7/2008 | Ahn et al. | |
| 7,402,876 B2 | 7/2008 | Ahn et al. | |
| 7,405,454 B2 | 7/2008 | Ahn et al. | |
| 7,410,668 B2 | 8/2008 | Ahn | |
| 7,410,910 B2 | 8/2008 | Ahn et al. | |
| 7,410,917 B2 | 8/2008 | Ahn et al. | |
| 7,411,237 B2 | 8/2008 | Ahn et al. | |
| 7,429,515 B2 | 9/2008 | Ahn et al. | |
| 7,439,194 B2 | 10/2008 | Ahn et al. | |
| 7,494,939 B2 | 2/2009 | Ahn et al. | |
| 7,498,247 B2 | 3/2009 | Ahn et al. | |
| 7,508,025 B2 | 3/2009 | Eldridge et al. | |
| 7,508,648 B2 | 3/2009 | Ahn et al. | |
| 7,510,983 B2 | 3/2009 | Ahn et al. | |
| 7,511,326 B2 | 3/2009 | Ahn et al. | |

| | | |
|---|---|---|
| 7,531,869 B2 | 5/2009 | Ahn et al. |
| 2001/0002280 A1 | 5/2001 | Sneh |
| 2001/0009695 A1 | 7/2001 | Saanila et al. |
| 2001/0030352 A1 | 10/2001 | Ruf et al. |
| 2001/0036106 A1 | 11/2001 | Kato et al. |
| 2002/0000593 A1 | 1/2002 | Nishiyama et al. |
| 2002/0001971 A1 | 1/2002 | Cho |
| 2002/0020429 A1 | 2/2002 | Selbrede |
| 2002/0024080 A1 | 2/2002 | Derderian et al. |
| 2002/0025628 A1 | 2/2002 | Derderian et al. |
| 2002/0028541 A1 | 3/2002 | Lee et al. |
| 2002/0046705 A1 | 4/2002 | Sandhu et al. |
| 2002/0048910 A1 | 4/2002 | Taylor et al. |
| 2002/0068466 A1 | 6/2002 | Lee et al. |
| 2002/0086507 A1 | 7/2002 | Park et al. |
| 2002/0086555 A1 | 7/2002 | Ahn et al. |
| 2002/0089023 A1 | 7/2002 | Yu et al. |
| 2002/0089063 A1 | 7/2002 | Ahn et al. |
| 2002/0090806 A1 | 7/2002 | Ahn et al. |
| 2002/0094632 A1 | 7/2002 | Agarwal et al. |
| 2002/0100418 A1 | 8/2002 | Sandhu et al. |
| 2002/0102818 A1 | 8/2002 | Sandhu et al. |
| 2002/0110991 A1 | 8/2002 | Li |
| 2002/0111001 A1 | 8/2002 | Ahn |
| 2002/0122885 A1 | 9/2002 | Ahn |
| 2002/0130338 A1 | 9/2002 | Ahn et al. |
| 2002/0135048 A1 | 9/2002 | Ahn et al. |
| 2002/0142536 A1 | 10/2002 | Zhang et al. |
| 2002/0146916 A1 | 10/2002 | Irino et al. |
| 2002/0155688 A1 | 10/2002 | Ahn et al. |
| 2002/0155689 A1 | 10/2002 | Ahn et al. |
| 2002/0164420 A1 | 11/2002 | Derderian et al. |
| 2002/0167089 A1 | 11/2002 | Ahn et al. |
| 2002/0177293 A1 | 11/2002 | Wilk et al. |
| 2002/0190294 A1 | 12/2002 | Iizuka et al. |
| 2002/0192974 A1 | 12/2002 | Ahn et al. |
| 2002/0192975 A1 | 12/2002 | Ahn |
| 2002/0192979 A1 | 12/2002 | Ahn |
| 2002/0195056 A1 | 12/2002 | Sandhu et al. |
| 2003/0003635 A1 | 1/2003 | Paranjpe et al. |
| 2003/0003702 A1 | 1/2003 | Ahn |
| 2003/0003730 A1 | 1/2003 | Li |
| 2003/0008243 A1 | 1/2003 | Ahn et al. |
| 2003/0017717 A1 | 1/2003 | Ahn et al. |
| 2003/0020169 A1 | 1/2003 | Ahn et al. |
| 2003/0020180 A1 | 1/2003 | Ahn et al. |
| 2003/0040196 A1 | 2/2003 | Lim et al. |
| 2003/0043637 A1 | 3/2003 | Forbes et al. |
| 2003/0045078 A1 | 3/2003 | Ahn et al. |
| 2003/0045082 A1 | 3/2003 | Eldridge et al. |
| 2003/0048666 A1 | 3/2003 | Eldridge et al. |
| 2003/0049942 A1 | 3/2003 | Haukka et al. |
| 2003/0104666 A1 | 6/2003 | Bojarczuk, Jr. et al. |
| 2003/0119246 A1 | 6/2003 | Ahn |
| 2003/0119291 A1 | 6/2003 | Ahn et al. |
| 2003/0132491 A1 | 7/2003 | Ahn |
| 2003/0141560 A1 | 7/2003 | Sun |
| 2003/0157764 A1 | 8/2003 | Ahn et al. |
| 2003/0170389 A1 | 9/2003 | Sandhu |
| 2003/0170403 A1 | 9/2003 | Doan et al. |
| 2003/0175411 A1 | 9/2003 | Kodas et al. |
| 2003/0176049 A1* | 9/2003 | Hegde et al. ................ 438/591 |
| 2003/0181039 A1 | 9/2003 | Sandhu et al. |
| 2003/0183156 A1 | 10/2003 | Dando et al. |
| 2003/0193061 A1 | 10/2003 | Osten |
| 2003/0207032 A1 | 11/2003 | Ahn et al. |
| 2003/0207540 A1 | 11/2003 | Ahn et al. |
| 2003/0207564 A1 | 11/2003 | Ahn et al. |
| 2003/0207593 A1 | 11/2003 | Derderian et al. |
| 2003/0213987 A1 | 11/2003 | Basceri |
| 2003/0227033 A1 | 12/2003 | Ahn et al. |
| 2003/0228747 A1 | 12/2003 | Ahn et al. |
| 2003/0232511 A1 | 12/2003 | Metzner et al. |
| 2003/0235064 A1 | 12/2003 | Batra et al. |
| 2003/0235961 A1 | 12/2003 | Metzner et al. |
| 2004/0004244 A1 | 1/2004 | Ahn et al. |
| 2004/0004245 A1 | 1/2004 | Forbes et al. |
| 2004/0004247 A1 | 1/2004 | Forbes et al. |
| 2004/0004859 A1 | 1/2004 | Forbes et al. |
| 2004/0009679 A1 | 1/2004 | Yeo et al. |
| 2004/0012043 A1 | 1/2004 | Gealy et al. |
| 2004/0023461 A1 | 2/2004 | Ahn et al. |
| 2004/0023516 A1 | 2/2004 | Londergan et al. |
| 2004/0033701 A1 | 2/2004 | Ahn et al. |
| 2004/0038525 A1 | 2/2004 | Meng et al. |
| 2004/0038554 A1 | 2/2004 | Ahn |
| 2004/0040494 A1 | 3/2004 | Vaartstra et al. |
| 2004/0043541 A1 | 3/2004 | Ahn et al. |
| 2004/0043569 A1 | 3/2004 | Ahn |
| 2004/0043635 A1 | 3/2004 | Vaartstra |
| 2004/0097022 A1 | 5/2004 | Werkhoven et al. |
| 2004/0110348 A1 | 6/2004 | Ahn et al. |
| 2004/0110391 A1 | 6/2004 | Ahn et al. |
| 2004/0144980 A1 | 7/2004 | Ahn et al. |
| 2004/0159863 A1 | 8/2004 | Eldridge et al. |
| 2004/0164357 A1 | 8/2004 | Ahn et al. |
| 2004/0175882 A1 | 9/2004 | Ahn et al. |
| 2004/0183108 A1 | 9/2004 | Ahn |
| 2004/0185654 A1 | 9/2004 | Ahn |
| 2004/0214399 A1 | 10/2004 | Ahn et al. |
| 2004/0222476 A1 | 11/2004 | Ahn et al. |
| 2004/0233010 A1 | 11/2004 | Akram et al. |
| 2004/0262700 A1 | 12/2004 | Ahn et al. |
| 2005/0009370 A1 | 1/2005 | Ahn |
| 2005/0020017 A1 | 1/2005 | Ahn et al. |
| 2005/0023574 A1 | 2/2005 | Forbes et al. |
| 2005/0023584 A1 | 2/2005 | Derderian et al. |
| 2005/0023594 A1 | 2/2005 | Ahn et al. |
| 2005/0023595 A1 | 2/2005 | Forbes et al. |
| 2005/0023602 A1 | 2/2005 | Forbes et al. |
| 2005/0023603 A1 | 2/2005 | Eldridge et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0026349 A1 | 2/2005 | Forbes et al. |
| 2005/0026374 A1 | 2/2005 | Ahn et al. |
| 2005/0026458 A1 | 2/2005 | Basceri et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0032292 A1 | 2/2005 | Ahn et al. |
| 2005/0034662 A1 | 2/2005 | Ahn |
| 2005/0037563 A1 | 2/2005 | Ahn |
| 2005/0054165 A1 | 3/2005 | Ahn et al. |
| 2005/0077519 A1 | 4/2005 | Ahn et al. |
| 2005/0087134 A1 | 4/2005 | Ahn |
| 2005/0124174 A1 | 6/2005 | Ahn et al. |
| 2005/0138262 A1 | 6/2005 | Forbes |
| 2005/0140462 A1 | 6/2005 | Akram et al. |
| 2005/0145957 A1 | 7/2005 | Ahn et al. |
| 2005/0158973 A1 | 7/2005 | Ahn et al. |
| 2005/0164521 A1 | 7/2005 | Ahn et al. |
| 2005/0173755 A1 | 8/2005 | Forbes |
| 2005/0212119 A1 | 9/2005 | Shero et al. |
| 2005/0227442 A1 | 10/2005 | Ahn et al. |
| 2006/0183272 A1 | 8/2006 | Ahn et al. |
| 2006/0223337 A1 | 10/2006 | Ahn et al. |
| 2006/0246741 A1 | 11/2006 | Ahn et al. |
| 2006/0252211 A1 | 11/2006 | Ahn et al. |
| 2007/0018214 A1 | 1/2007 | Ahn |
| 2007/0049051 A1 | 3/2007 | Ahn et al. |
| 2007/0049054 A1 | 3/2007 | Ahn et al. |
| 2007/0134931 A1 | 6/2007 | Ahn et al. |
| 2008/0029790 A1 | 2/2008 | Ahn et al. |
| 2008/0032424 A1 | 2/2008 | Ahn et al. |
| 2008/0032465 A1 | 2/2008 | Ahn et al. |
| 2008/0048225 A1 | 2/2008 | Ahn et al. |
| 2008/0087890 A1 | 4/2008 | Ahn et al. |
| 2008/0121962 A1 | 5/2008 | Forbes et al. |
| 2008/0124907 A1 | 5/2008 | Forbes et al. |
| 2008/0124908 A1 | 5/2008 | Forbes et al. |
| 2008/0191350 A1 | 8/2008 | Ahn et al. |
| 2008/0191351 A1 | 8/2008 | Ahn et al. |
| 2008/0193791 A1 | 8/2008 | Ahn et al. |
| 2008/0194094 A1 | 8/2008 | Ahn et al. |
| 2008/0217676 A1 | 9/2008 | Ahn et al. |
| 2008/0274625 A1 | 11/2008 | Ahn et al. |

| | | | |
|---|---|---|---|
| 2008/0283940 A1 | 11/2008 | Ahn et al. | |
| 2009/0032910 A1 | 2/2009 | Ahn et al. | |
| 2009/0134499 A1 | 5/2009 | Ahn et al. | |

FOREIGN PATENT DOCUMENTS

| | | |
|---|---|---|
| EP | 1096042 | 5/2001 |
| EP | 1124262 | 8/2001 |
| EP | 1124262 A2 | 8/2001 |
| JP | 62-199019 | 9/1987 |
| JP | 5090169 | 4/1993 |
| JP | 2001-332546 | 11/2001 |
| WO | WO-01/97257 | 12/2001 |
| WO | WO-02/31875 | 4/2002 |
| WO | WO-02/43115 | 5/2002 |

OTHER PUBLICATIONS

Aarik, Jaan, "Influence of substrate temperature on atomic layer growth and properties of $HfO_2$ thin films", *Thin Solid Films*, 340(1-2), (1999),110-116.

Aarik, Jaan, "Phase transformations in hafnium dioxide thin films grown by atomic layer deposition at high temperatures", *Applied Surface Science*, 173(1-2), (Mar. 2001),15-21.

Aarik, Jaan, "Texture development in nanocrystalline hafnium dioxide thin films grown by atomic layer deposition", *Journal of Crystal Groth*, 220(1-2), (Nov. 15, 2000),105-113.

Bendoraitis, J G., et al., "Optical energy gaps in the monoclinic oxides of hafnium and zirconium and their solid solutions", *Journal of Physical Chemistry*, 69(10), (1965),3666-3667.

Bright, A A., et al., "Low-rate plasma oxidation of Si in a dilute oxygen/helium plasma for low-temperature gate quality $Si/SiO_2$ interfaces", *Applied Physics Letters*, 58(6), (Feb. 1991),619-621.

Callegari, A., et al., "Physical and electrical characterization of Hafnium oxide and Hafnium silicate sputtered films", *Journal of Applied Physics*, 90(12), (Dec. 15, 2001),6466-75.

Chang, Hyo S., et al., "Excellent thermal stability of $Al_2O_3/ZrO_2/Al_2O_3$ stack structure of metal-oxide-semiconductor gate dielectrics application", *Applied Physics Letters*, 80(18), (May 6, 2002),3385-7.

Chen, P. J., et al., "Thermal stability and scalability of Zr-aluminate-based high-k gate stacks", *Symposium on VLSI Technology Digest*, (2002),192-3.

Cheng, Baohong et al., "The Impact of High-k Gate Dielectrics and Metal Gate Electrodes Sub-100nm MOSFET's", *IEEE Transactions on Electron on Devices*, 46(7), (Jul. 1999),1537-1544.

Clark-Phelps, R. B., et al., "Engineered Tantalum Aluminate and Hafnium Aluminate ALD Films for Ultrathin Dielectric Films with Improved Electric and Thermal Properties", *Gate Stack and Silicide Issued in Silicon Processing II. Symposium (Materials Research Society Symposium Proceedings* vol. 670), (Apr. 17, 2001),K2.2.1-6.

Conley, Jr., J. F., et al., "Atomic Layer Deposition of Hafnium Oxide Using Anhydrous Hafnium Nitrate", *Electrochemical and Solid-State Letters*, 5(5), (2002),C57-059

Copel, M., et al., "Structure and stability of ultrathin zirconium oxide layers on Si(001)", *Applied Physics Letters*, 76(4), (Jan. 2000),436-438.

Desu, S B., "Minimization of Fatigue in Ferroelectric Films", *Physica Status Solidi A*, 151(2), (1995),467-480.

Dimoulas, A., et al.,"'Structural and electrical quality of the high-k dielectric Y2O3 on Si (001): Dependence on growth parameters", *Journal of Applied Physics*, 92(1), (Jul. 1, 2002),426-431.

Engelhardt, M. "Modern Applications of Plasma Etching and Patterning in Silicon Process Technology", *Contributions to Plasma Physics*, 39(5), (1999),473-478.

Forsgren, Katarina, "Atomic Layer Deposition of HfO2 using hafnium iodide", Conference held in Monterey, California, (May 2001),1 page.

Forsgren, Katarina, "CVD and ALD of Group IV- and V-Oxides for Dielectric Applications", *Comprehensive Summaries of Uppsala Dissertation from the Faculty of Science and Technology*, 665, (2001).

Fuyuki, Takashi et al., "Electronic Properties of the Interface between Si and $TiO_2$ Deposited at Very Low Temperatures", *Japanese Journal of Applied Physics, Part 1 (Regular Papers & Short Notes)*, 25(9), (Sep. 1986), 1288-1291.

Fuyuki, Takashi et al., "Initial stage of ultra-thin $SiO_2$ formation at low temperatures using activated oxygen", *Applied Surface Science*, 117-118, (Jun. 1997),123-126.

Gartner, M, "Spectroellipsometric characterization of lanthanide-doped $TiO_2$ films obtained via the sol-gel technique", *Thin Solid Films*, 234(1-2), (1993),561-565.

Geller, S., et al., "Crystallographic Studies of Perovskite-like Compounds. II. Rare Earth Aluminates", *Acta Cryst.*, 9, (May 1956),1019-1025.

Giess, E. A., et al., "Lanthanide gallate perovskite-type substrates for epitaxial, high-T/sub c/ superconducting $Ba_2Y Cu_3/O_7$ delta / films", *IBM Journal of Research and Development*, 34(6), (Nov. 1990),916-926.

Guillaumot, B, et al., "75 nm damascene metal gate and high-k integration for advanced CMOS devices", *Technical Digest of International Electron Devices Meeting 2002*, (2002),355-358.

Gusev, E P., "Ultrathin High-K Dielectrics Grown a by Atomic Layer Deposition: A Comparative Study of $ZrO_2$, $HfO_2$, $Y_2O_3$ and $Al_2O_3$,", *Electrochemical Society Proceedings* vol. 2001-9, (2001),189-195.

Gutowski, M J., "Thermodynamic stability of high-K dielectric metal oxides $ZrO_2$ and $HfO_2$ in contact with Si and $SiO_2$", *Applied Physics Letters*, 80(11), (Mar. 18, 2002),1897-1899.

Hirayama, Masaki, et al., "Low-Temperature Growth of High-Integrity Silicon Oxide Films by Oxygen Radical Generated in High Density Krypton Plasma", *International Electron Devices Meeting 1999. Technical Digest*, (1999),249-252.

Hubbard, K. J., et al., "Thermodynamic stability of binary oxides in contact with silicon", *Journal of Materials Research*, 11(11), (Nov. 1996),2757-2776.

Hunt, C. E., et al., "Direct bonding of micromachined silicon wafers for laser diode heat exchanger applications", *Journal of Micromechanics and Microengineering*, 1(3), (Sep. 1991),152-156.

Jeon, Sanghun, et al., "Ultrathin nitrided-nanolaminate ($Al_2O_3/ZrO_2/Al_2O_3$) for metal-oxide-semiconductor gate dielectric applications", *Journal of Vacuum Science & Technology B: Microelectronics and Nanometer Structures*, 20(3), (May 2002),1143-5.

Jeong, Chang-Wook "Plasma-Assisted Atomic Layer Growth of High-Quality Aluminum Oxide Thin Films", *Japanese Journal of Applied Physics, Part 1: Regular Papers and Short Notes and Review Papers*, 40(1), (Jan. 2001),285-289.

Jung, H S., et al., "Improved current performance of CMOSFETs with nitrogen incorporated HfO/sub 2/-Al/sub 2/O/sub 3/ laminate gate dielectric", *Technical Digest of International Electron Devices Meeting 2002*, (2002),853-856.

Kang, L, et al., "MOSFET devices with polysilicon on single-layer HfO/sub 2/ high-K dielectrics", *International Electron Devices Meeting 2000. Technical Digest. IEDM*, (2000),35-8.

Kawai, Y, et al., "Ultra-low-temperature growth of high-integrity gate oxide films by low-energy Ion-assisted oxidation", *Applied Physics Letters*, 64(17), (Apr. 1994),2223-2225.

Keomany, D, et al., "Sol gel preparation of mixed cerium-titanium oxide thin films", *Solar Energy Materials and Solar Cells*, 33(4), (Aug. 1994),429-441.

Kim, C. T., et al., "Application of Al2O3 Grown by Atomic Layer Deposition to DRAM and FeRAM", *International Symposium in Integrated Ferroelectrics*, (Mar. 2000),316.

Kim, D., et al., "Atomic Control of Substrate Termination and Heteroepitaxial Growth of $SrTiO_3/LaAlO_3$ Films", *Journal of the Korean Physical Society*, 36(6), (Jun. 2000),444-448.

Kim, Y, "Substrate dependence on the optical properties of $Al_2O_3$ films grown by atomic layer deposition", *Applied Physics Letters*, vol. 71, No. 25, (Dec. 22, 1997),3604-3606.

Krauter, G., et al., "Room Temperature Silicon Wafer Bonding with Ultra-Thin Polymer Films", *Advanced Materials*, 9(5), (1997),417-420.

Kukli, Kaupo, "Atomic Layer Deposition of Titanium Oxide from Til4 and H2O2", *Chemical Vapor Deposition*, 6(6), (2000),303-310.

Kukli, Kaupo, "Comparison of hafnium oxide films grown by atomic layer deposition from iodide and chloride precursors", *Thin Solid Films*, 416, (2002),72-79.

Kukli, K., et al., "Controlled growth of yttrium oxysulphide thin films by atomic layer deposition", *Materials Science Forum*, 315-317, (1999),216-221.

Kukli, Kaupo, et al., "Dielectric Properties of Zirconium Oxide Grown by Atomic Layer Deposition from Iodide Precursor", *Journal of The Electrochemical Society*, 148(12),(2001),F227-F232.

Kukli, Kaupo, et al., "Influence of thickness and growth temperature on the properties of zirconium oxide films growth by atomic layer deposition on silicon", *Thin Solid Films*, 410(1-2), (2002),53-60.

Kukli, Kaupo, "Low-Temperature Deposition of Zirconium Oxide-Based Nanocrystalline Films by Alternate Supply of $Zr[OC(CH_3)_3]_4$ and $H_2O$", *Chemical Vapor Deposition*, 6(6), (2000),297-302.

Lee, A E., et al., "Epitaxially grown sputtered $LaAlO_3$ films", *Applied Physics Letters*, 57(19), (Nov. 1990),2019-2021.

Lee, S J., "High quality ultra thin CVD $HfO_2$ gate stack with poly-Si gate electrode", *Electron Devices Meeting, 2000. IEDM Technical Digest. International*, (2000),31-34.

Lee, Cheng-Chung, et al., "Ion-assisted deposition of silver thin films", *Thin Solid Films*, 359(1), (Jan. 2000),95-97.

Lee, Dong H., et al., "Metalorganic chemical vapor deposition of $TiO_2$:N anatase thin film on Si substrate", *Applied Physics Letters*, 66(7), (Feb. 1995),815-816.

Lee, L P., et al., "Monolithic 77 K dc SQUID magnetometer", *Applied Physics Letters*, 59(23), (Dec. 1991),3051-3053.

Lee, C. H., "MOS Characteristics of Ultra Thin Rapid Thermal CVD $ZrO_2$ and Zr Silicate Gate Dielectrics", *Electron Devices Meeting, 2000. IEDM Technical Digest. International*, (2002),27-30.

Lee, C H., et al., "MOS Devices with High Quality Ultra Thin CVD $ZrO_2$ Gate Dielectrics and Self-Aligned TaN and TaN/Poly-Si Gate electrodes", *2001 Symposium on VLSI, Technology Digest of Technical Papers*, (2001),137-138.

Lee, Byoung H., et al., "Ultrathin Hafnium Oxide with Low Leakage and Excellent Reliability for Alternative Gate Dielectric Application", *Technical Digest of IEDM*, (1999),133-136.

Leskela, M, "ALD precursor chemistry: Evolution and future challenges", *Journal de Physique IV (Proceedings)*, 9(8), (Sep. 1999),837-852.

Liu, C. T., "Circuit Requirement and Integration Challenges of Thin Gate Dielectrics for Ultra Small MOSFETs", *International Electron Devices Meeting 1998. Technical Digest*, (1998),747-750.

Liu, Y C., et al., "Growth of ultrathin $SiO_2$ on Si by surface irradiation with an O/sub 2/+Ar electron cyclotron resonance microwave plasma at low temperatures", *Journal of Applied Physics*, 85(3), (Feb. 1999),1911-1915.

Lucovsky, G, et al., "Microscopic model for enhanced dielectric constants in low concentration SiO/sub 2/-rich noncrystalline Zr and Hf silicate alloys", *Applied Physics Letters*, 77(18), (Oct. 2000),2912-2914.

Luo, Z J., et al., "Ultra-thin $ZrO_2$ (or Silicate) with High Thermal Stability for CMOS Gate Applications", *2001 Symposium on VLSI Technology Digest of Technical Papers*, (2001),135-136.

Martin, P J., et al., "Ion-beam-assisted deposition of thin films", *Applied Optics*, 22(1), (Jan. 1983),178-184.

Molodyk, A A., et al., "Volatile Surfactant-Assisted MOCVD: Application to LaAlO3 Thin Film Growth", *Chemical Vapor Deposition*, 6(3), (Jun. 2000),133-138.

Molsa, Heinz, et al., "Growth of yttrium oxide thin films from beta-diketonate precursor", *Advanced Materials for Optics and Electronics*, 4(6), (Nov.-Dec. 1994),389-400.

Muller, D. A., "The electronic structure at the atomic scale of ultrathin gate oxides", *Nature*, 399, (Jun. 24, 1999),758-61.

Nakajima, Anri, "Atomic-layer deposition of ZrO/sub 2/ with a Si nitride barrier layer", *Applied Physics Letters*, 81(15), (Oct. 2002),2824-2826.

Neumayer, D A., et al., "Materials characterization of ZrO/sub 2/-SiO/sub 2/ and HfO/sub 2/-SiO/sub 2/ binary oxides deposited by chemical solution deposition", *Journal of Applied Physics*, 90(4), (Aug. 15, 2001),1801-1808.

Nieminen, Minna, et al., "Formation and stability of lanthanum oxide thin films deposited from B-diketonate precursor", *Applied Surface Science*, 174(2), (Apr. 16, 2001),155-165.

Ohring, Milton, "The Materials Science of Thin Films", *Boston : Academic Press*, (1992),118,121,125.

Osten, H. J., et al., "High-k gate dielectrics with ultra-low leakage current based on praseodymium oxide", *International Electron Devices Meeting 2000. Technical Digest. IEDM*, (2000),653-656.

Pan, Tung M., et al., "High quality ultrathin $CoTiO_3$ high-k gate dielectrics", *Electrochemical and Solid-State Letters*, 3(9), (Sep. 2000),433-434.

Pan, Tung M., et al., "High-k cobalt-titanium oxide dielectrics formed by oxidation of sputtered Co/Ti or Ti/Co films", *Applied Physics Letters*, 78(10), (Mar. 5, 2001),1439-1441.

Park, Jaehoo, et al., "Chemical vapor deposition of HfO/sub 2/ thin films using a novel carbon-free precursor: characterization of the interface with the silicon substrate", *Journal of the Electrochemical Society*, 149(1), (2002),G89-G94.

Park, Byung-Eun et al., "Electrical properties of LaAlO3/Si and Sr0.8Bi2.2Ta2O9/LaAlO3/Si structures", *Applied Physics Letters*, 79(6), (Aug. 2001),806-808.

Park, Byoung K., et al., "Interfacial reaction between chemically vapor-deposited HfO2 thin films and a HF-cleaned Si substrate during film growth and postannealing", *Applied Physics Letters*, 80(13), (Apr. 1, 2002),2368-70.

Perkins, Charles M., et al., "Electrical and materials properties of ZrO2 gate dielectrics grown by atomic layer chemical vapor deposition", *Applied Physics Letters*, 78(16), (Apr. 2001),2357-2359.

Poveshchenko, V P., et al., "Investigation of the phase composition of films of zirconium, hafnium and yttrium oxides", *Soviet Journal of Optical Technology*, 51(5), (1984),277-279.

Qi, Wen-Jie, et al., "MOSCAP and MOSFET characteristics using ZrO2 gate dielectric deposited directly on Si", *Electron Devices Meeting, 1999. IEDM Technical Digest. International*, (1999),145-148.

Qi, Wen-Jie, et al., "Performance of MOSFETs with ultra thin ZrO2 and Zr-silicate gate dielectrics", *2000 Symposium on VLSI Technology, Digest of Technical Papers*, (2000),40-41.

Rahtu, Antti, et al., "Atomic Layer Deposition of Zirconium Titanium Oxide from Titanium Isopropoxide and Zirconium Chloride", *Chemistry of Materials*, 13(5), (May 2001),1528-1532.

Rayner Jr., G, et al., "The structure of plasma-deposited and annealed pseudo-binary $ZrO_2$-$SiO_2$ alloys", *Materials Research Society Symposium—Proceedings*, 611, (2000),C131-C139.

Ritala, Mikko, "Atomic Layer Epitaxy Growth of Titanium, Zirconium and Hafnium Dioxide Thin Films", *Annales Academiae Scientiarum Fennicae*, (1994),24-25.

Ritala, Mikko, "Zirconium dioxide thin films deposited by ALE using zirconium tetrachloride as precursor", *Applied Surface Science*, 75, (Jan. 1994),333-340.

Robertson, J., "Band offsets of wide-band-gap oxides and implications for future electronic devices", *Journal of Vacuum Science & Technology B (Microelectronics and Nanometer Structures(*, 18(3), (May-Jun. 2000),1785-1791.

Saito, Yuji, et al., "Advantage of Radical Oxidation for Improving Reliability of Ultra-Thin Gate Oxide", *2000 Symposium on VLSI Technology Digest of Technical Papers*, (2000),176-177.

Saito, Yuji, et al., "High-Integrity Silicon Oxide Grown at Low-Temperature by Atomic Oxygen Generated in High-Density Krypton Plasma", *Extended Abstracts of the 1999 International Conference on Solid State Devices and Materials*, (1999),152-153.

Shanware, A, et al., "Reliability evaluation of HfSiON gate dielectric film with 12.8 A SiO2 equivalent Technical thickness", *International Electron Devices Meeting Digest*, (2001),6.6.1-6.6.4.

Shin, Chang H., et al., "Fabrication and Characterization of MFISFET using Al2O3 Insulating Layer for Non-Volatile Memory", *12th International Symposium in Integrated Ferroelectrics*, (Mar. 2000),1-9.

Smith, Ryan C., "Chemical Vapour Deposition of the Oxides of Titanium, Zirconium and Hafnium for Use as High-k Materials in Microelectronic Devices. A Carbon-free Precursor for the Synthesis of Hafnium Dioxide", *Advanced Materials for Optics and Electronics*, 10(3-5), (2000),105-114.

Sneh, Ofer, "Thin film atomic layer deposition equipment for semiconductor processing", *Thin Solid Films*, 402(1-2), (2002),248-261.

Song, Hyun-Jung, et al., "Atomic Layer Deposition of Ta2O5 Films Using Ta(OC2H5)5 and NH3", *Ultrathin SiO/sub 2/ and High-K Materials for ULSI Gate Dielectrics. Symposium*, (1999),469-471.

Suntola, T., "Atomic Layer Epitaxy", *Handbook of Crystal Growth, 3; Thin Films of Epitaxy, Part B: Growth Mechanics and Dynamics*, Amsterdam,(1994),601-663.

Suntola, Tuomo, "Atomic layer epitaxy", *Thin Solid Films*, 216(1), (Aug. 28, 1992),84-89.

Sze, S M., "Physics of Semiconductor Devices", *New York : Wiley*, (1981),431.

Sze, S M., "Physics of Semiconductor Devices", *New York : Wiley*, (1981),473.

Takemoto, J. H., et al., "Microstrip Resonators and Filters Using High-TC Superconducting Thin Films on LaAlO3", *IEEE Transaction on Magnetics*, 27(2), (Mar. 1991),2549-2552.

Tavel, B , et al., "High performance 40 nm nMOSFETs with HfO/sub 2/ gate dielectric and polysilicon damascene gate", *Technical Digest of International Electron Devices Meetings 2002*, (2002),429-432.

Van Dover, R B., "Amorphous lanthanide-doped TiOx dielectric films", *Applied Physics Letters*, 74(20), (May 1999),3041-3043.

Viirola, H , "Controlled growth of antimony-doped tin dioxide thin films by atomic layer epitaxy", *Thin Solid Films*, 251, (Nov. 1994),127-135.

Viirola, H , et al., "Controlled growth of tin dioxide thin films by atomic layer epitaxy", *Thin Solid Films*, 249(2), (Sep., 1994),144-149.

Wilk, G D., et al., "Hafnium and zirconium silicates for advanced gate dielectrics", *Journal of Applied Physics*, 87(1), (Jan. 2000),484-492.

Wilk, G. D., "High-K gate dielectrics: Current status and materials properties considerations", *Journal of Applied Physics*, 89(10), (May 2001),5243-5275.

Wolf, Stanley , et al., "Silicon Processing for the VLSI Era—vol. I: Process Technology", *Second Edition, Lattice Press*, Sunset Beach, California,(2000),443.

Yamaguchi, Takeshi , "Band Diagram and Carrier Conduction Mechanism in $ZrO_2$/Zr-silicate/Si MIS Structure Fabricated by Pulsed-laser-ablation Deposition", *Electron Devices Meeting, 2000. IEDM Technical Digest. International*, (2000),19-22.

Yamaguchi, Takeshi , et al., "Study on Zr-Silicate Interfacial Layer of $ZrO_2$-MIS Structure Fabricated by Pulsed Laser Ablation Deposition Method", *Solid State Devices and Materials*, (2000),228-229.

Zhang, H. , "Atomic Layer Deposition of High Dielectric Constant Nanolaminates", *Journal of the Electrochemical Society*, 148(4), (Apr. 2001),F63-F66.

Zhang, H , et al., "High permitivity thin film nanolaminates", *Journal of Applied Physics*, 87(4), (Feb. 2000),1921-1924.

Zhu, W , et al., "$HfO_2$ and HfAlO for CMOS: Thermal Stability and Current Transport", *IEEE International Electron Device Meeting 2001*, (2001),463-466.

Zucker, O , et al., "Application of Oxygen Plasma Processing to Silicon Direct Bonding", *Sensors and Actuators A*, 36, (1993),227-231.

Aarik, Jaan , et al., "Influence of substrate temperature on atomic layer growth and properties of HfO/sub 2/ thin films", *Thin Solid Films*, 340(1-2), (1999), 110-116.

Aarik, Jaan , et al., "Phase transformations in hafnium dioxide thin films grown by atomic layer deposition at high temperatures", *Applied Surface Science*, 173(1-2), (Mar. 2001),15-21.

Aarik, Jaan , et al., "Texture development in nanocrystalline hafnium dioxide thin films grown atomic layer deposition", *Journal of Crystal Growth*, 220(1-2), (Nov. 15, 2000), 105-113.

Ahn, Kie Y., et al., "ALD of Amorphous Lanthanide Doped Tiox Films", U.S. Appl. No. 11/092,072, filed Mar. 29, 2005.

Ahn, Kie Y., et al., "Atomic Layer Deposited Hafnium Tantalum Oxide Dielectrics", U.S. Appl. No. 11/029,757, filed Jan. 5, 2005.

Ahn, Kie Y., et al., "Atomic Layer Deposited Lanthanum Aluminum Oxide Dielectric Layer", U.S. Appl. No. 10/930,167, filed Aug. 31, 2004.

Ahn, Kie Y., et al., "Atomic Layer Deposited Lanthanum Hafnium Oxide Dielectrics", U.S. Appl. No. 11/010,529, filed Dec. 13, 2004.

Ahn, Kie Y., et al., "Atomic Layer Deposited Titanium Aluminum Oxide Films", U.S. Appl. No. 10/931,533, filed Aug. 31, 2004.

Ahn, Kie Y., et al., "Atomic Layer Deposition of Hf3N4/HfO2 Films As Gate Dielectrics",U.S. Appl. No. 11/063,717, filed Feb. 23, 2005.

Ahn, Kie Y., et al., "Atomic Layer Deposition of Zirconium-Doped Tantalum Oxide Films", U.S. Appl. No. 10/909,959, filed Aug. 2, 2004.

Ahn, Kie Y., et al., "Atomic Layer Deposition of Zr3N4/ZrO2 Films As Gate Dielectrics", U.S. Appl. No. 11/058,563, filed Feb. 15, 2005.

Ahn, Kie Y., et al., "Hybrid ALD-CVD of PrXOY/ZrO2 Films As Gate Dielectrics", U.S. Appl. No. 11/010,766, filed Dec. 13, 2004.

Ahn, Kie Y., et al., "Ruthenium Gate for a Lanthanide Oxide Dielectric Layer", U.S. Appl. No. 10/926,812, filed Aug. 26, 2004.

Chang, Hyo S., et al., "Excellent thermal stability of Al2O3/ZrO2/Al2O3 stack structure of metal-oxide-semiconductor gate dielectrics application", *Applied Physics Letters*, 80(18), (May 6, 2002), 3385-7.

Engelhardt, M. , "Modern Applications of Plasma Etching and Patterning in Silicon Process Technology", *Contributions to Plasma Physics*, 39(5), (1999), 473-478.

Fuyuki, Takashi , et al., "Electronic Properties of the Interface between Si and TiO2 Deposited at Very Low Temperatures", *Japanese Journal of Applied Physics, Part 1 (Regular Papers & Short Notes)*, 25(9), (Sep. 1986), 1288-1291.

Fuyuki, Takashi , et al., "Initial stage of ultra-thin SiO/sub 2/ formation at low temperatures using activated oxygen", *Applied Surface Science*, 117-118, (Jun. 1997), 123-126.

Gusev, E P., "Ultrathin High-K Dielectrics Grown by Atomic Layer Deposition: A Comparative Study of ZrO2, HfO2, Y2O3 and Al2O3", *Electrochemical Society Proceedings* vol. 2001-9, (2001), 189-195.

Hubbard, K. J., "Thermodynamic stability of binary oxides in contact with silicon", *Journal of Materials Research*, 11(11), Nov. 1996 , 2757-2776.

Jeon, Sanghun, et al., "Ultrathin nitrided-nanolaminate ($Al_2O_3$/$ZrO_2$/$Al_2O_3$) for metal-oxide-semiconductor gate dielectric applications", *Journal of Vacuum Science & Technology B: Microelectronics and Nanometer Structures*, 20(3), (May 2002), 1143-5.

Jeong, Chang-Wook , et al., "Plasma-Assisted Atomic Layer Growth of High-Quality Aluminum Oxide Thin Films", *Japanese Journal of Applied Physics, Part 1: Regular Papers and Short Notes and Review Papers*, 40(1), (Jan. 2001), 285-289.

Kim, C T., et al., "Application of Al2O3 Grown by Atomic Layer Deposition to DRAM and FeRAM", *International Symposium in Integrated Ferroelectrics*, (Mar. 2000), 316.

Kim, Y , et al., "Substrate dependence on the optical properties of Al2O3 films grown by atomic layer deposition", *Applied Physics Letters*, vol. 71, No. 25, (Dec. 22, 1997), 3604-3606.

Kukli, Kaupo , "Atomic Layer Deposition of Titanium Oxide from Til4 and H2O2", *Chemical Vapor Deposition*, 6(6), (2000), 303-310.

Kukli, Kaupo , et al., "Comparison of hafnium oxide films grown by atomic layer deposition from iodide and chloride precursors", *Thin Solid Films*, 416, (2002), 72-79.

Kukli, K , et al., "Controlled growth of yttrium oxysulphide thin films by atomic layer deposition", *Materials Science Forum*, 315-317, (1999), 216-221.

Kukli, Kaupo , et al., "Low-Temperature Deposition of Zirconium Oxide-Based Nanocrystalline Films by Alternate Supply of Zr[OC(CH3)3]4 and H2O", *Chemical Vapor Deposition*, 6(6), 2000 , 297-302.

Lee, A E., et al., "Epitaxially grown sputtered LaAlO3 films", *Applied Physics Letters*, 57(19), (Nov. 1990), 2019-2021.

Lee, S. J., et al., "Hafnium oxide gate stack prepared by in situ rapid thermal chemical vapor deposition process for advanced gate dielectrics", *Journal of Applied Physics*, 92 (5), (Sep. 1, 2002), 2807-09.

Lee, S J., et al., "High quality ultra thin CVD HfO2 gate stack with poly-Si gate electrode", *Electron Devices Meeting, 2000. IEDM Technical Digest. International*, (2000), 31-34.

Lee, Dong H., et al., "Metalorganic chemical vapor deposition of TiO/sub 21:N anatase thin film on Si substrate", *Applied Physics Letters*, 66(7), (Feb. 1995), 815-816.

Lee, C. H., et al., "MOS Characteristics of Ultra Thin Rapid Thermal CVD ZrO2 and Zr Silicate Gate Dielectrics", *Electron Devices Meeting, 2000. IEDM Technical Digest. International*, (2000), 27-30.

Lee, C H., et al., "MOS Devices with High Quality Ultra Thin CVD ZrO2 Gate Dielectrics and Self-Aligned TaN and TaN/Poly-Si Gate electrodes", *2001 Symposium on VLSI, Technology Digest of Technical Papers*, (2001), 137-138.

Leskela, M, et al., "ALD precursor chemistry: Evolution and future challenges", *Journal de Physique IV (Proceedings)*, 9(8), (Sep. 1999), 837-852.

Liu, Y C., et al., "Growth of ultrathin SiO/sub 2/ on Si by surface irradiation with an O/sub 2/+Ar electron cyclotron resonance microwave plasma at low temperatures", *Journal of Applied Physics*, 85(3), (Feb. 1999), 1911-1915.

Luo, Z J., et al., "Ultra-thin ZrO2 (or Silicate) with High Thermal Stability for CMOS Gate Applications", *2001 Symposium on VLSI Technology Digest of Technical Papers*, (2001), 135-136.

Martin, P. J., et al., "Ion-beam-assisted deposition of thin films", *Applied Optics*, 22(1), (Jan. 1983), 178-184.

Molodyk, A A., et al., "Volatile Surfactant-Assisted MOCVD: Application to LaAlO$_3$ Thin Film Growth", *Chemical Vapor Deposition*, 6(3), (Jun. 2000), 133-138.

Molsa, Heini, et al., "Growth of yttrium oxide thin films from beta-diketonate precursor", *Advanced Materials for Optics and Electronics*, 4(6), (Nov.-Dec. 1994), 389-400.

Muller, D. A., et al., "The electronic structure at the atomic scale of ultrathin gate oxides", *Nature*, 399, (Jun. 24, 1999), 758-61.

Nieminen, Minna, et al., "Formation and stability of lanthanum oxide thin films deposited from B-diketonate precursor", *Applied Surface Science*, 174(2), (Apr. 16, 2001), 155-165.

Pan, Tung M., et al., "High quality ultrathin CoTiO/sub 3/ high-k gate dielectrics", *Electrochemical and Solid-State Letters*, 3(9), (Sep. 2000), 433-434.

Park, Byung-Eun, et al., "Electrical properties of LaAlO3/Si and Sr0.8Bi2.2Ta2O9/LaAlO3/Si structures", *Applied Physics Letters*, 79(6), (Aug. 2001), 806-808.

Qi, Wen-Jie, et al., "MOSCAP and MOSFET characteristics using Zr02 gate dielectric deposited directly on Si", *Electron Devices Meeting, 1999. IEDM Technical Digest. International*, (1999), 145-148.

Rathu, Antti, et al., "Atomic Layer Deposition of Zirconium Titanium Oxide from Titanium Isopropoxide and Zirconium Chloride", *Chemistry of Materials*, 13(5), (May 2001), 1528-1532.

Rayner Jr., G., et al., "The structure of plasma-deposited and annealed pseudo-binary ZrO2-SiO2 alloys", *Materials Research Society Symposium—Proceedings*, 611, (2000), C131-C139.

Ritala, Mikko, "Zirconium dioxide thin films deposited by ALE using as zirconium tetrachloride as precursor", *Applied Surface Science*, 75, (Jan. 1994), 333-340.

Saito, Yuji, et al., "High-Integrity Silicon Grown at Low-Temperature by Atomic Oxygen Generated in High-Density Krypton Plasma", *Extended Abstracts of the 1999 International Conference on Solid State Devices and Materials*, (1999), 152-153.

Smith, Ryan C., et al., "Chemical Vapour Deposition of the Oxides of Titanium, Zirconium and Hafnium for Use as High-k Materials in Microelectronic Devices. A Carbon-free Precursor for the Synthesis of Hafnium Dioxide", *Advanced Materials for Optics and Electronics*, 10(3-5), (2000), 105-14.

Sneh, Ofer, et al., "Thin film atomic layer deposition equipment for semiconductor processing", *Thin Solid Films*, 402(1-2), (Jan. 2002), 248-261.

Suntola, T, "Atomic layer epitaxy", *Thin Solid Films*, 216(1), (Aug. 28, 1992), 84-89.

Viirola, H, "Controlled growth of tin oxide thin films by atomic layer epitaxy", *Thin Solid Films*, 249(2), (Sep. 1994), 144-149.

Wilk, G. D., et al., "High-K gate dielectrics: Current status and materials properties considerations", *Journal of Applied Physics*, 89(10), (May 2001), 5243-5275.

Zhang, H, "High permittivity thin film nanolaminates", *Journal of Applied Physics*, 87(4), (Feb. 2000), 1921-1924.

Zhu, W, et al., "HfO2 and HfAlO for CMOS: Thermal Stability and Current Transport", *IEEE International Electron Device Meeting 2001*, (2001), 463-466.

Dimoulas, A., et al., "Structural and electrical quality of the high-k dielectric Y$_2$O$_3$ on Si (001): Dependence on growth parameters", *Journal of Applied Physics*, 92(1), (Jul. 1, 2002), 426-431.

U.S. Appl. No. 09/945,535, filed Aug. 30, 2001, Highly Reliable Amorphous High-K Gate Odixe ZrO2.

U.S. Appl. No. 10/137,058, filed May 2, 2002, Atomic Layer Depositon and Conversion.

U.S. Appl. No. 10/137,168, filed May 2, 2002, Methods for Atomic-Layer Deposition of Aluminum Oxides in Integrated Circuits.

U.S. Appl. No. 10/137,499, filed May 2, 2002, Atomic Layer-Deposited LaAlO3 Films for Gate Dielectrics.

U.S. Appl. No. 10/163,481, filed Jun. 5, 2002, Atomic Layer-Deposited HfAlO3 Films for Gate Dielectrics.

U.S. Appl. No. 10/163,686, filed Jun. 5, 2002, A Method Including Forming Gate Dielectrics Having Multiple Lanthanide Oxide Layers.

U.S. Appl. No. 10/209,518, filed Jul. 30, 2002, Atomic Layer Deposited Nanolaminates of HfO2/ZrO2 Films as Gate Dielectrics.

U.S. Appl. No. 10/229,903, filed Aug. 28, 2002, Atomic Layer Deposited HfSiON Dielectric Films.

U.S. Appl. No. 10/233,309, filed Aug. 29, 2002, Atomic Layer Deposited Lanthanide Doped TiOX Dielectric Films.

U.S. Appl. No. 10/309,583, filed Dec. 4, 2002, Atomic Layer Deposited Zr-Sn-Ti-O Films Using Tii4.

U.S. Appl. No. 10/309,935, filed Dec. 4, 2002, Atomic Layer Deposited Zr-Sn-Ti-O Films.

U.S. Appl. No. 10/379,470, filed Mar. 4, 2003, Atomic Layers Deposited Dielectric Layers.

U.S. Appl. No. 10/403,734, filed Mar. 31, 2003, Atomic Layer Deposited ZrAlxOy Dielectric Layers.

U.S. Appl. No. 10/420,307, filed Apr. 22, 2003, Atomic Layer Deposited ZrTiO4 Films.

U.S. Appl. No. 10/602,323, filed Jun. 24, 2003, Lathanide Oxide / Hafnium Oxide Dielectric Layers.

U.S. Appl. No. 10/602,315, filed Jun. 24, 2003, Lanthanide Oxide / Hafnium Oxide Dielectrics.

U.S. Appl. No. 09/881,408, filed Jun. 13, 2001, Dielectric Layer Forming Method and Devices Formed Therewith.

U.S. Appl. No. 10/765,619, filed Jan. 27, 2004, High-Quality Praseodymium Gate Dielectrics.

U.S. Appl. No. 10/768,597, filed Jan. 30, 2004, Low-Temperature Grown High-Quality Ultra-Thin Praseodymium Gate Dielectrics.

U.S. Appl. No. 10/789,042, filed Feb. 27, 2004, Atomic Layer-Deposited LaAlO3 Films for Gate Dielectrics.

U.S. Appl. No. 11/036,296, filed Jan. 14, 2005, Low-Temperature Grown High Quality Ultra-Thin CoTiO3 Gate Dielectrics.

U.S. Appl. No. 10/909,959, filed Aug. 2, 2004, Atomic Layer Deposition of Zirconium-Doped Tantalum Oxide Films.

U.S. Appl. No. 10/863,953, filed Jun. 9, 2004, Highly Reliable Amorphous High-k Gate Dielectric ZrOxNy.

U.S. Appl. No. 10/931,533, filed Aug. 31, 2004, Atomic Layer Deposited Titanium Aluminum Oxide Films.

U.S. Appl. No. 10/926,812, filed Aug. 26, 2004, Ruthenium Gate for a Lanthanide Oxide Dielectric Layer.

U.S. Appl. No. 10/930,167, filed Aug. 31, 2004, Atomic Layer Deposited Lanthanum Aluminum Oxide Dielectric Layer.

U.S. Appl. No. 10,929,272, filed Aug. 30, 2004, Atomic Layer Deposition and Conversion.

U.S. Appl. No. 10/930,138, filed Aug. 31, 2004, Evaporation of Y-Si-O Films for Medium-k Dieletrics.

U.S. Appl. No. 10/930,516, filed Aug. 31, 2004, Atomic Layer Deposited HfSiON Dielectric Films.

U.S. Appl. No. 10/931,341, filed Aug. 31, 2004, Atomic Layer Deposited Zr-Sn-Ti-O Films Using TiI4.

U.S. Appl. No. 10/930,431, filed Aug. 31, 2004, Atomic Layer-Deposited HfAlO3 Films for Gate Dielectrics.

U.S. Appl. No. 10/931,365, filed Aug. 31, 2004, Pr2O3-Based La-oxide Gate Dielectrics.

U.S. Appl. No. 10/931,364, filed Aug. 31, 2004, Lanthanide Doped TiOx Dielectric Films by Plasma Oxidation.

U.S. Appl. No. 10/931,343, filed Aug. 31, 2004, Lanthanide Oxide / Hafnium Oxide Dielectric Layers.

U.S. Appl. No. 10/931,340, filed Aug. 31, 2004, Lanthanide Oxide / Hafnium Oxide Dielectrics.

U.S. Appl. No. 10/931,845, filed Aug. 31, 2004, Methods, Systems, and Apparatus for Uniform Chemical-Vapor Depositions.

U.S. Appl. No. 10/931,595, filed Aug. 31, 2004, Methods, Systems, and Apparatus for Uniform Chemical-Vapor Depositions.

U.S. Appl. No. 10/931,356, filed Aug. 31, 2004, Highly Reliable Amorphous High-K Gate Oxide ZrO2.

U.S. Appl. No. 11/010,529, filed Dec. 13, 2004, Atomic Layer Deposited Lanthanum Hafnium Oxide Dielectrics.
U.S. Appl. No. 11/029,757, filed Jan. 5, 2005, Atomic Layer Deposited Hafnium Tantalum Oxide Dielectrics.
U.S. Appl. No. 11/010,766, filed Dec. 13, 2004, Hybrid ALD-CVD of PrXOY/ZrO2 Films As Gate Dielectrics.
U.S. Appl. No. 11/053,577, filed Feb. 8, 2005, Atomic Layer Deposition of DY-Doped HFO2 Films As Gate Dielectrics.
U.S. Appl. No. 11/058,563, filed Feb. 15, 2005, Atomic Layer Deposition of Zr3N4/ZrO2 Films As Gate Dielectrics.
U.S. Appl. No. 11/063,717, filed Feb. 25, 2005, Atomic Layer Deposition of Hf3N4/HfO2 Films As Gate Dielectrics.
U.S. Appl. No. 11/031,289, filed Jan. 7, 2005, Lanthanide Doped TiOx Dielectric Films by Plasma Oxidation.
U.S. Appl. No. 11/059,594, filed Feb. 16, 2005, Evaporated LaAlO3 Films for Gate Dielectrics.
U.S. Appl. No. 11/092,702, filed Mar. 29, 2005, ALD of Amorphous Lanthanide Doped Tiox Films.
U.S. Appl. No. 11/093,104, filed Mar. 29, 2005, Atomic Layer Deposited Titanium Silicon Oxide Films.
U.S. Appl. No. 11/117,121, filed Apr. 28, 2005, Atomic Layer Deposited Zirconium Silicon Oxide Films.
U.S. Appl. No. 11/117,125, filed Apr. 28, 2005, Atomic Layer Deposition of a Ruthenium Layer to a Lanthanide Oxide Dielectric Layer.
U.S. Appl. No. 11/084,968, filed Mar. 21, 2005, Zr-Sn-Ti-O Films.
U.S. Appl. No. 11/176,738, filed Jul. 7, 2005, Metal-Substituted Transistor Gates.
U.S. Appl. No. 11/148,505, filed Jun. 9, 2005, Atomic Layer Deposited Nanolaminates of HfO2/ZrO2 Films As Gate Dielectrics.
U.S. Appl. No. 11/189,075, filed Jul. 25, 2005, Magnesium Titanium Oxide Films.
U.S. Appl. No. 11/215,412, filed Aug. 29, 2005, Ruthenium Gate for a Lanthanide Oxide Dielectric Layer.
U.S. Appl. No. 11/213,013, filed Aug. 26, 2005, Atomic Layer Deposited Dielectric Layers.
U.S. Appl. No. 11/212,306, filed Aug. 26, 2005, Atomic Layer Deposited Zirconium Titanium Oxide Films.
U.S. Appl. No. 11/204,745, filed Aug. 16, 2005, Evaporation of Y-Si-O Films for Medium-k Dieletrics.
U.S. Appl. No. 11/214,693, filed Aug. 29, 2005, Atomic Layer Deposited Zr-Sn-Ti-O Films Uging TiI4.
U.S. Appl. No. 11/215,451, filed Aug. 29, 2005, Systems and Apparatus for Atomic-Layer Deposition.

* cited by examiner

NANOLAMINATES OF HAFNIUM OXIDE AND ZIRCONIUM OXIDE

RELATED APPLICATIONS

The present application is a Divisional of U.S. application Ser. No. 10/209,581, filed Jul. 30, 2002, now U.S. Pat. No. 6,921,702, which is incorporated herein by reference.

This application is related to the following, commonly assigned applications, incorporated herein by reference:

U.S. application Ser. No. 10/163,481, now U.S. Pat. No. 7,135,421, entitled: "Atomic Layer-Deposited Hafnium Aluminum Oxide Films;"

U.S. application Ser. No. 10/137,499, now U.S. Pat. No. 7,045,430, entitled: "Atomic Layer-Deposited $LaAlO_3$ Films for Gate Dielectrics;"

U.S. application Ser. No. 10/137,058, entitled: "Atomic Layer Deposition and Conversion;"

U.S. application Ser. No. 09/945,535, entitled: "Highly Reliable Amorphous High-K Gate Oxide $ZrO_2$;"

U.S. application Ser. No. 10/137,168, now U.S. Pat. No. 7,160,577, entitled: "Methods for Atomic-Layer Deposition of Aluminum Oxides in Integrated Circuits;" and U.S. Pat. No. 6,852,167, entitled: "Methods, Systems, and Apparatus for Uniform Chemical-Vapor Depositions."

FIELD OF THE INVENTION

The invention relates to semiconductor devices and device fabrication. Specifically, the invention relates to gate dielectric layers of transistor devices and their method of fabrication.

BACKGROUND OF THE INVENTION

The semiconductor device industry has a market driven need to improve speed performance, improve its low static (off-state) power requirements, and adapt to a wide range of power supply and output voltage requirements for it silicon based microelectronic products. In particular, in the fabrication of transistors, there is continuous pressure to reduce the size of devices such as transistors. The ultimate goal is to fabricate increasingly smaller and more reliable integrated circuits (ICs) for use in products such as processor chips, mobile telephones, or memory devices such as DRAMs. The smaller devices are frequently powered by batteries, where there is also pressure to reduce the size of the batteries, and to extend the time between battery charges. This forces the industry to not only design smaller transistors, but to design them to operate reliably with lower power supplies.

Currently, the semiconductor industry relies on the ability to reduce or scale the dimensions of its basic devices, primarily, the silicon based metal-oxide-semiconductor field effect transistor (MOSFET). A common configuration of such a transistor is shown in FIG. 1. While the following discussion uses FIG. 1 to illustrate a transistor from the prior art, one skilled in the art will recognize that the present invention could be incorporated into the transistor shown in FIG. 1 to form a novel transistor according to the invention. The transistor 100 is fabricated in a substrate 110 that is typically silicon, but could be fabricated from other semiconductor materials as well. The transistor 100 has a first source/drain region 120 and a second source/drain region 130. A body region 132 is located between the first source/drain region and the second source/drain region, where the body region 132 defines a channel of the transistor with a channel length 134. A gate dielectric, or gate oxide 140 is located on the body region 132 with a gate 150 located over the gate dielectric. Although the gate dielectric can be formed from materials other than oxides, the gate dielectric is typically an oxide, and is commonly referred to as a gate oxide. The gate may be fabricated from polycrystalline silicon (polysilicon), or other conducting materials such as metal may be used.

In fabricating transistors to be smaller in size and reliably operate on lower power supplies, one important design criteria is the gate dielectric 140. The mainstay for forming the gate dielectric has been silicon dioxide, $SiO_2$. A thermally grown amorphous $SiO_2$ layer provides an electrically and thermodynamically stable material, where the interface of the $SiO_2$ layer with underlying Si provides a high quality interface as well as superior electrical isolation properties. In typical processing, use of $SiO_2$ on Si has provided defect charge densities on the order of $10^{10}/cm^2$, midgap interface state densities of approximately $10^{10}/cm^2$ eV, and breakdown voltages in the range of 15 MV/cm. With such qualities, there would be no apparent need to use a material other than $SiO_2$, but increased scaling and other requirements for gate dielectrics create the need to find other dielectric materials to be used for a gate dielectric.

What is needed is an alternate dielectric material for forming a gate dielectric that has a high dielectric constant relative to $SiO_2$, and is thermodynamically stable with respect to silicon such that forming the dielectric on a silicon layer will not result in $SiO_2$ formation, or diffusion of material, such as dopants, into the gate dielectric from the underlying silicon layer.

DETAILED DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1:
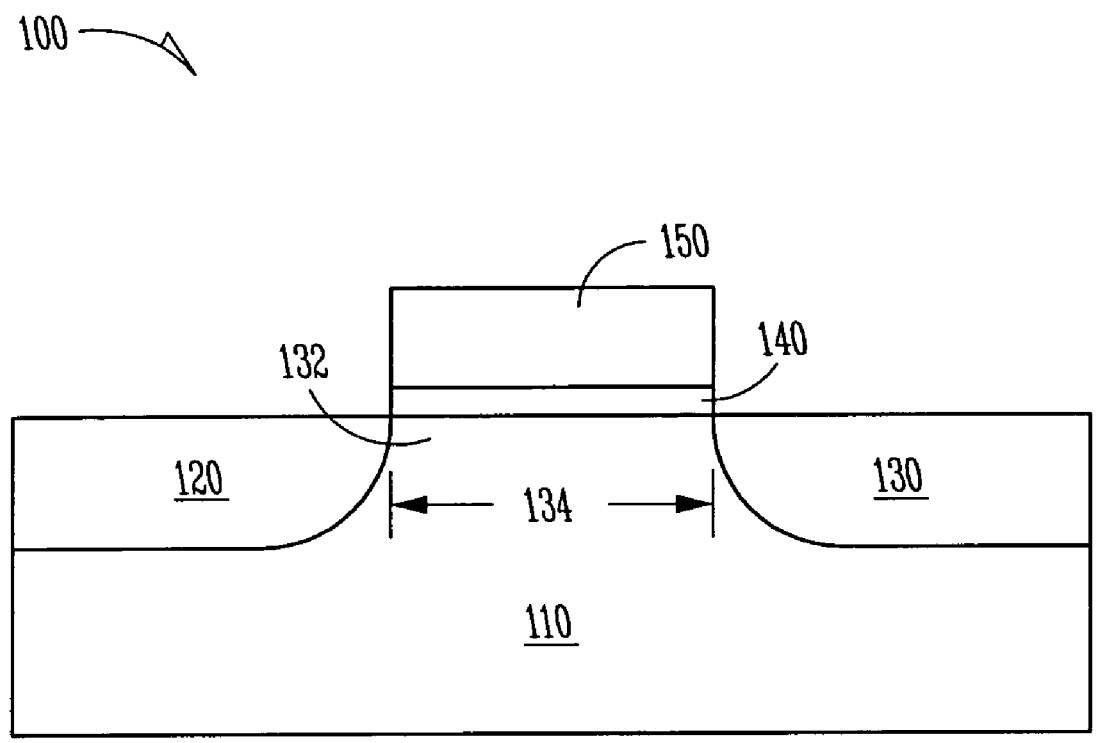
FIG. 1 shows a common configuration of a transistor in which an embodiment of a gate dielectric can be formed, according to the teaching of the present invention.

A gate dielectric 140 of FIG. 1, when operating in a transistor, has both a physical gate dielectric thickness and an equivalent oxide thickness ($t_{eq}$). The equivalent oxide thickness quantifies the electrical properties, such as capacitance, of a gate dielectric 140 in terms of a representative physical thickness. $t_{eq}$ is defined as the thickness of a theoretical SiO$_2$ layer that would be required to have the same capacitance density as a given dielectric, ignoring leakage current and reliability considerations.

A SiO$_2$ layer of thickness, t, deposited on a Si surface as a gate dielectric will have a $t_{eq}$ larger than its thickness, t. This $t_{eq}$ results from the capacitance in the surface channel on which the SiO$_2$ is deposited due to the formation of a depletion/inversion region. This depletion/inversion region can result in $t_{eq}$ being from 3 to 6 Angstroms (Å) larger than the SiO$_2$ thickness, t. Thus, with the semiconductor industry driving to someday scale the gate dielectric equivalent oxide thickness to under 10 Å, the physical thickness requirement for a SiO$_2$ layer used for a gate dielectric would be need to be approximately 4 to 7 Å.

Additional requirements on a SiO$_2$ layer would depend on the gate electrode used in conjunction with the SiO$_2$ gate dielectric. Using a conventional polysilicon gate would result in an additional increase in $t_{eq}$ for the SiO$_2$ layer. This additional thickness could be eliminated by using a metal gate electrode, though metal gates are not currently used in complementary metal-oxide-semiconductor field effect transistor (CMOS) technology. Thus, future devices would be designed towards a physical SiO$_2$ gate dielectric layer of about 5 Å or less. Such a small thickness requirement for a SiO$_2$ oxide layer creates additional problems.

Silicon dioxide is used as a gate dielectric, in part, due to its electrical isolation properties in a SiO$_2$—Si based structure. This electrical isolation is due to the relatively large band gap of SiO$_2$ (8.9 eV) making it a good insulator from electrical conduction. Signification reductions in its band gap would eliminate it as a material for a gate dielectric. As the thickness of a SiO$_2$ layer decreases, the number of atomic layers, or monolayers of the material in the thickness decreases. At a certain thickness, the number of monolayers will be sufficiently small that the SiO$_2$ layer will not have a complete arrangement of atoms as in a larger or bulk layer. As a result of incomplete formation relative to a bulk structure, a thin SiO$_2$ layer of only one or two monolayers will not form a full band gap. The lack of a full band gap in a SiO$_2$ gate dielectric would cause an effective short between an underlying Si channel and an overlying polysilicon gate. This undesirable property sets a limit on the physical thickness to which a SiO$_2$ layer can be scaled. The minimum thickness due to this monolayer effect is thought to be about 7-8 Å. Therefore, for future devices to have a $t_{eq}$ less than about 10 Å, other dielectrics than SiO$_2$ need to be considered for use as a gate dielectric.

For a typical dielectric layer used as a gate dielectric, the capacitance is determined as one for a parallel plate capacitance: $C = \kappa \epsilon_0 A/t$, where $\kappa$ is the dielectric constant, $\epsilon_0$ is the permittivity of free space, A is the area of the capacitor, and t is the thickness of the dielectric. The thickness, t, of a material is related to $t_{eq}$ for a given capacitance with the dielectric constant of SiO$_2$, $\kappa_{ox} = 3.9$, associated with $t_{eq}$, as $$t = (\kappa/\kappa_{ox})t_{eq} = (\kappa/3.9)t_{eq}.$$

Thus, materials with a dielectric constant greater than that of SiO$_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, the reduced equivalent oxide thickness of transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the microelectronics industry is still for Si based devices. This requires that the gate dielectric employed be grown on a silicon substrate or silicon layer, which places significant restraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness of the dielectric being formed, written as $$t_{eq} = t_{SiO2} + (\kappa_{ox}/\kappa) t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

In a recent article by G. D. Wilk et al., *Journal of Applied Physics*, vol. 89: no. 10, pp. 5243-5275 (2001), material properties of high dielectric materials for gate dielectrics were discussed. Among the information disclosed was the viability of $Al_2O_3$ as a substitute for $SiO_2$. $Al_2O_3$ was disclosed has having favourable properties for use as a gate dielectric such as high band gap, thermodynamic stability on Si up to high temperatures, and an amorphous structure. In addition, Wilk disclosed that forming a layer of $Al_2O_3$ on silicon does not result in a $SiO_2$ interfacial layer. However, the dielectric constant of $Al_2O_3$ is only 9, where thin layers may have a dielectric constant of about 8 to about 10. Though the dielectric constant of $Al_2O_3$ is in an improvement over $SiO_2$, a higher dielectric constant for a gate dielectric is desirable. Other dielectrics and their properties discussed by Wilk include

| Material | Dielectric Constant ($\kappa$) | Band gap $E_g$ (eV) | Crystal Structure(s) |
|---|---|---|---|
| $SiO_2$ | 3.9 | 8.9 | Amorphous |
| $Si_3N_4$ | 7 | 5.1 | Amorphous |
| $Al_2O_3$ | 9 | 8.7 | Amorphous |
| $Y_2O_3$ | 15 | 5.6 | Cubic |
| $La_2O_3$ | 30 | 4.3 | Hexagonal, Cubic |
| $Ta_2O_5$ | 26 | 4.5 | Orthorhombic |
| $TiO_2$ | 80 | 3.5 | Tetrag. (rutile, anatase) |
| $HfO_2$ | 25 | 5.7 | Mono., Tetrag., Cubic |
| $ZrO_2$ | 25 | 7.8 | Mono., Tetrag., Cubic |

One of the advantages using $SiO_2$ as a gate dielectric has been that the formation of the $SiO_2$ layer results in an amorphous gate dielectric. Having an amorphous structure for a gate dielectric is advantageous because grain boundaries in polycrystalline gate dielectrics provide high leakage paths. Additionally, grain size and orientation changes throughout a polycrystalline gate dielectric can cause variations in the film's dielectric constant. The abovementioned material properties including crystal structure are for the materials in a bulk form. The materials having the advantage of a high dielectric constants relative to $SiO_2$ also have the disadvantage of a crystalline form, at least in a bulk configuration. The best candidates for replacing $SiO_2$ as a gate dielectric are those with high dielectric constant, which can be fabricated as a thin layer with an amorphous form.

In an embodiment, a dielectric layer includes a nanolaminate of $HfO_2/ZrO_2$. Various embodiments include structures for transistors, memory devices, and electronic systems with gate dielectrics containing nanolaminates of $HfO_2/ZrO_2$. Such gate dielectrics provide a significantly thinner equivalent oxide thickness compared with a silicon oxide gate having the same physical thickness. Alternatively, such gate dielectrics provide a significantly thicker physical thickness than a silicon oxide gate dielectric having the same equivalent oxide thickness.

In an embodiment according to the teachings of the present invention, a gate dielectric includes thin layers of $HfO_2$ and $ZrO_2$ forming a nanolaminate. The term "nanolaminate" means a composite film of ultra thin layers of two or more materials in a layered stack, where the layers are alternating layers of materials of the composite film. Typically, nanolaminates have thicknesses of an order of magnitude in the nanometer range. Each individual material layer of the nanolaminate can have thicknesses as low as a monolayer of the material. A nanolaminate of $HfO_2$ and $ZrO_2$ includes at least one thin layer of $HfO_2$, and one thin layer of $ZrO_2$, and is typically written as a nanolaminate of $HfO_2/ZrO_2$. In one embodiment, nanolaminates of $HfO_2/ZrO_2$ are grown using atomic layer deposition (ALD), also known as atomic layer epitaxy (ALE).

ALD was developed in the early 1970's as a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. Between the pulses, the reaction chamber is purged with a gas, which in many cases is an inert gas, or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other on the substrate aggressively, one ALD cycle can be preformed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward, simple manner by controlling the number of growth cycles.

ALD was originally developed to manufacture luminescent and dielectric films needed in electroluminescent displays. Significant efforts have been made to apply ALD to the growth of doped zinc sulfide and alkaline earth metal sulfide films. Additionally, ALD has been studied for the growth of different epitaxial II-V and II-VI films, nonepitaxial crystalline or amorphous oxide and nitride films and multilayer structures of these. There also has been considerable interest towards the ALD growth of silicon and germanium films, but due to the difficult precursor chemistry, this has not been very successful.

The precursors used in an ALD process may be gaseous, liquid or solid. However, liquid or solid precursors must be volatile. The vapor pressure must be high enough for effective mass transportation. Also, solid and some liquid precursors need to be heated inside the reaction chamber and introduced through heated tubes to the substrates. The necessary vapor pressure must be reached at a temperature below the substrate temperature to avoid the condensation of the precursors on the substrate. Due to the self-limiting growth mechanisms of ALD, relatively low vapor pressure solid precursors can be used though evaporation rates may somewhat vary during the process because of changes in their surface area.

There are several other requirements for precursors used in ALD. The precursors must be thermally stable at the substrate temperature because their decomposition would destroy the surface control and accordingly the advantages of the ALD method which relies on the reactant of the precursor at the substrate surface. Of course, a slight decomposition, if slow compared to the ALD growth, can be tolerated.

The precursors have to chemisorb on or react with the surface, though the interaction between the precursor and the surface as well as the mechanism for the adsorption is different for different precursors. The molecules at the substrate surface must react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction must be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

The advantages of RS-ALD include continuity at an interface, conformality over a substrate, use of low temperature and mildly oxidizing processes, growth thickness dependent solely on the number of cycles performed, and ability to engineer multilayer laminate films with resolution of one to two monolayers. RS-ALD allows for deposition control on the order on monolayers and the ability to deposit monolayers of amorphous films.

RS-ALD processes provide for the formation of nanolaminates. These nanolaminates can be engineered in various forms. In one form, the transition between material layers of the nanolaminate can be made abrupt. In another form, the transition between material layers of the nanolaminate can be constructed with a graded composition. The graded composition can be formed by RS-ALD due its control of the deposition thickness per cycle.

In an embodiment, a layer of $HfO_2$ is formed on a substrate mounted in a reaction chamber using ALD in a repetitive sequence including pulsing a hafnium containing precursor into the reaction chamber followed by pulsing a purging gas, and then pulsing a first oxygen containing precursor into the chamber. In one embodiment using ALD, a layer of $HfO_2$ is formed using $HfI_4$ as a hafnium containing precursor, water vapor as a first oxygen containing precursor, and nitrogen as a purging gas and carrier gas. After forming a $HfO_2$ layer, a $ZrO_2$ layer is formed on the $HfO_2$ layer.

In one embodiment, the layer of $ZrO_2$ is formed by ALD. In particular, a repetitive sequence includes using $ZrI_4$ as a zirconium containing precursor along with a vapor solution of $HO_2$—$H_2O_2$ as a second oxygen containing precursor, and nitrogen as a purging gas and carrier gas. In another embodiment, the $ZrO_2$ layer is formed by depositing a layer of zirconium on the $HfO_2$ layer by thermal evaporation, and oxidizing the zirconium layer using a krypton(Kr)/oxygen($O_2$) mixed plasma to form a $HfO_2/ZrO_2$ composite layer. In another embodiment, the $ZrO_2$ layer is formed by pulsed-laser deposition. In yet another embodiment, the $ZrO_2$ layer is formed by jet-vapor deposition.

In one embodiment, precursor gases, in particular $HfI_4$, are used to form the $HfO_2$ layer for the $HfO_2/ZrO_2$ nanolaminate films used as a gate dielectric on a transistor body. Alternately, solid or liquid precursors can be used in an appropriately designed reaction chamber. ALD formation of other materials is disclosed in co-pending, commonly assigned U.S. patent application: entitled "Atomic Layer Deposition and Conversion," Ser. No. 10/137,058, and "Methods for Atomic-Layer Deposition of Aluminum Oxides in Integrated Circuits," Ser. No. 10/137,168, now U.S. Pat. No. 7,160,577.

Figure 2A:
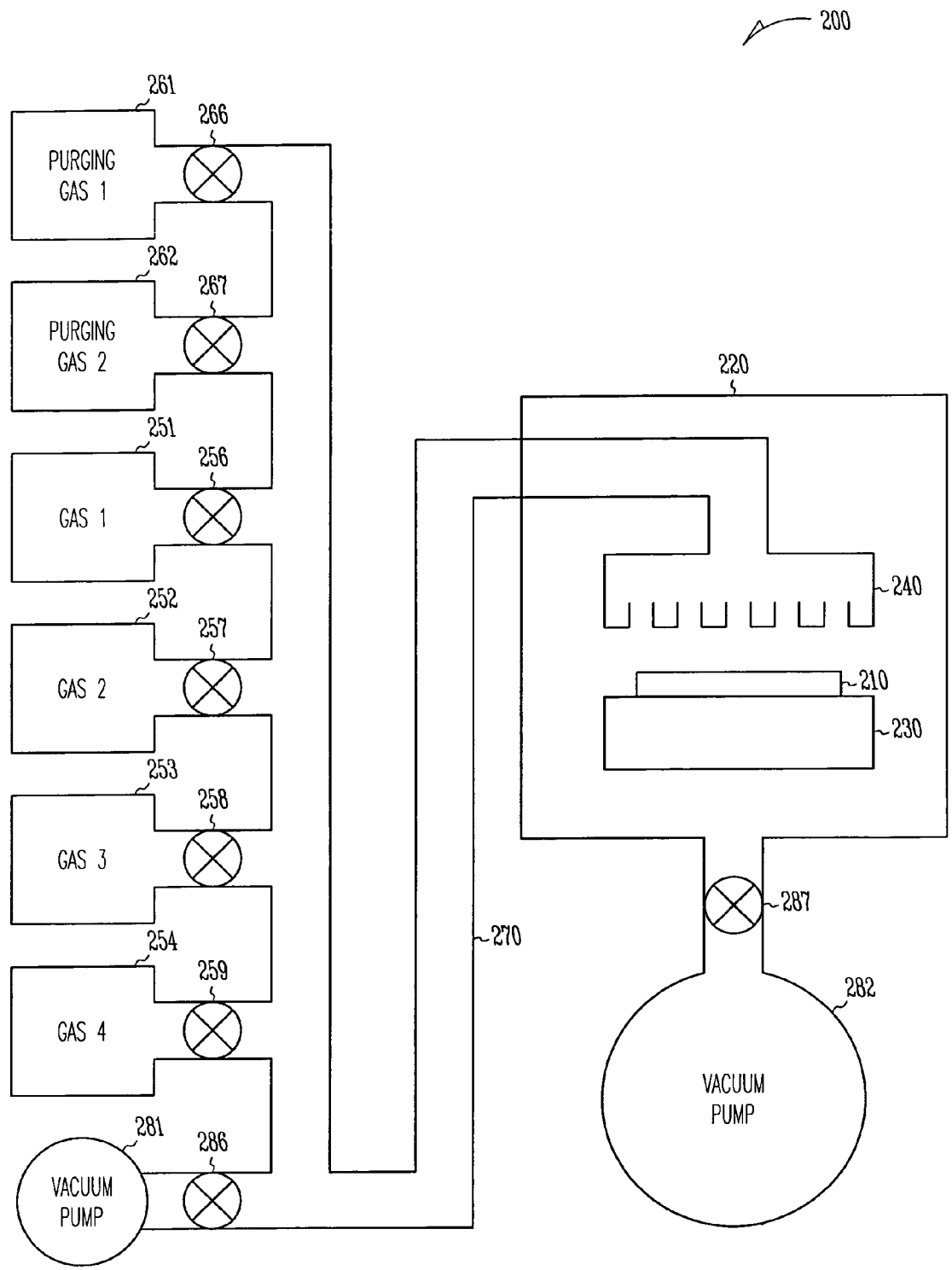
FIG. 2A shows an embodiment of an atomic layer deposition system for processing a layer of $HfO_2$ and a nanolaminate of $HfO_2/ZrO_2$, according to the teachings of the present invention.

FIG. 2A shows an embodiment of an atomic layer deposition system for processing layers of $HfO_2$ and nanolaminates of $HfO_2/ZrO_2$ according to the teachings of the present invention. The elements depicted are those elements necessary for discussion of the present invention such that those skilled in the art may practice the present invention without undue experimentation. A further discussion of the ALD reaction chamber can be found in, commonly assigned U.S. patent application: entitled "Methods, Systems, and Apparatus for Uniform Chemical-Vapor Depositions," Ser. No. 09/797,324, now U.S. Pat. No. 6,852,167, incorporated herein by reference.

In FIG. 2A, a substrate 210 is located inside a reaction chamber 220 of ALD system 200. Also located within the reaction chamber 220 is a heating element 230 which is thermally coupled to substrate 210 to control the substrate temperature. A gas-distribution fixture 240 introduces precursor gases to the substrate 210. Each precursor gas originates from individual gas sources 251-254 whose flow is controlled by mass-flow controllers 256-259, respectively. The gas sources 251-254 provide a precursor gas either by storing the precursor as a gas or by providing a location and apparatus for evaporating a solid or liquid material to form the selected precursor gas.

Also included in the ALD system are purging gas sources 261, 262, each of which is coupled to mass-flow controllers 266, 267, respectively. The gas sources 251-254 and the purging gas sources 261-262 are coupled by their associated mass-flow controllers to a common gas line or conduit 270 which is coupled to the gas-distribution fixture 240 inside the reaction chamber 220. Gas conduit 270 is also coupled to vacuum pump, or exhaust pump, 281 by mass-flow controller 286 to remove excess precursor gases, purging gases, and by-product gases at the end of a purging sequence from the gas conduit.

Vacuum pump, or exhaust pump, 282 is coupled by mass-flow controller 287 to remove excess precursor gases, purging gases, and by-product gases at the end of a purging sequence from the reaction chamber 220. For convenience, control displays, mounting apparatus, temperature sensing devices, substrate maneuvering apparatus, and necessary electrical connections as are known to those skilled in the art are not shown in FIG. 2A.

Figure 2B:
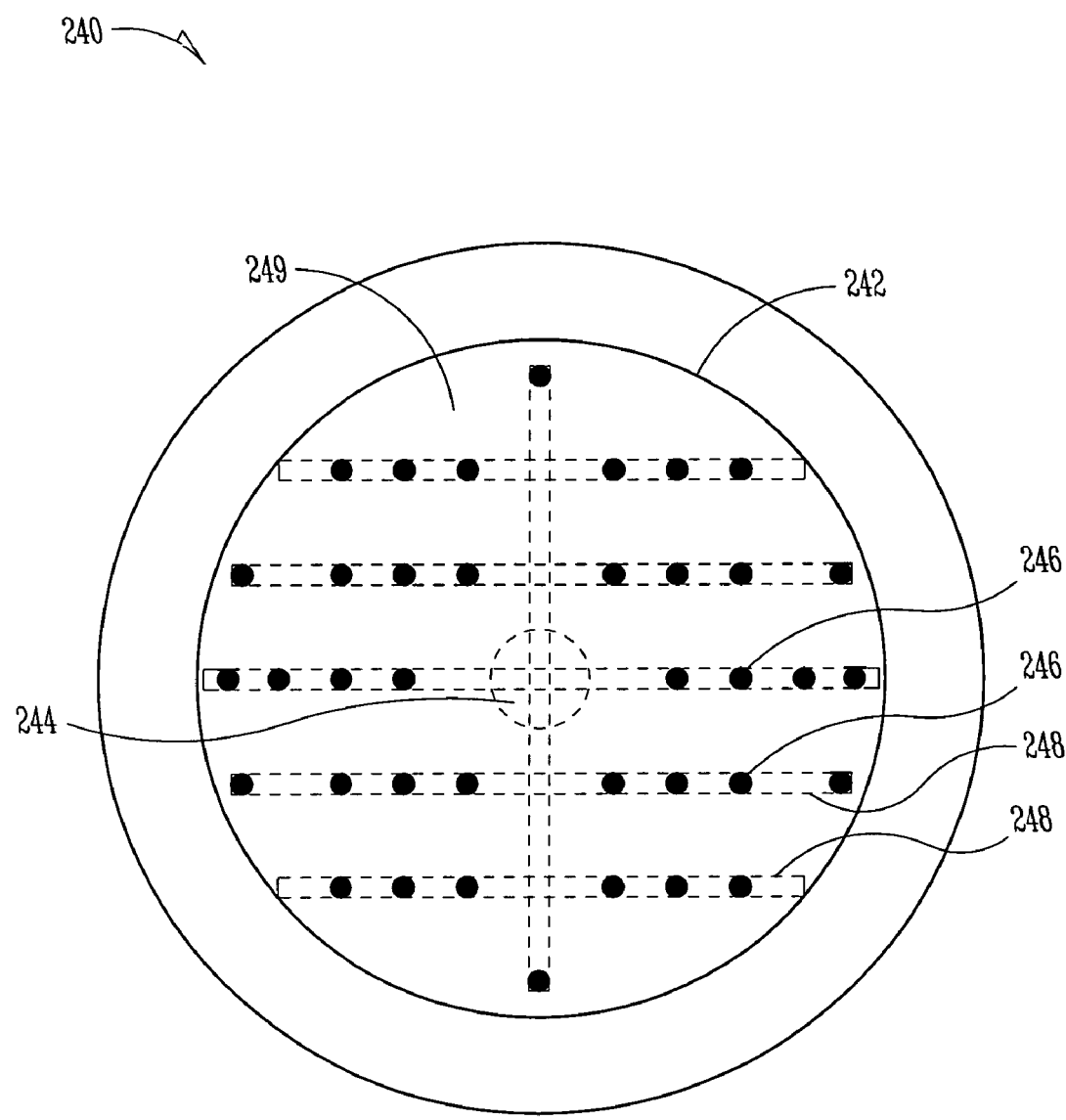
FIG. 2B shows an embodiment of a gas-distribution fixture of an atomic layer deposition chamber for processing a layer of $HfO_2$ and a nanolaminate of $HfO_2/ZrO_2$, according to the teachings of the present invention.

FIG. 2B shows an embodiment of a gas-distribution fixture of an atomic layer deposition chamber for processing layers of $HfO_2$ and nanolaminates of $HfO_2/ZrO_2$, according to the teachings of the present invention. Gas-distribution fixture 240 includes a gas-distribution member 242, and a gas inlet 244. Gas inlet 244 couples the gas-distribution member 242 to the gas conduit 270 of FIG. 2A. Gas-distribution member 242 includes gas-distribution holes, or orifices, 246 and gas-distribution channels 248. In the exemplary embodiment, holes 246 are substantially circular with a common diameter in the range of 15-20 microns, gas-distribution channels 248 have a common width in the range of 20-45 microns. The surface 249 of the gas distribution member having gas-distribution holes 246 is substantially planar and parallel to the substrate 210 of FIG. 2A. However, other embodiments use other surface forms as well as shapes and sizes of holes and channels. The distribution and size of holes may also affect deposition thickness and thus might be used to assist thickness control. Holes 246 are coupled through gas-distribution channels 248 to gas inlet 244. Though the ALD system 200 is well suited for practicing the present invention, other ALD systems commercially available can be used.

The use, construction and fundamental operation of reaction chambers for deposition of films are understood by those of ordinary skill in the art of semiconductor fabrication. The present invention may be practiced on a variety of such reaction chambers without undue experimentation. Furthermore, one of ordinary skill in the art will comprehend the necessary detection, measurement, and control techniques in the art of semiconductor fabrication upon reading the disclosure.

Figure 3:
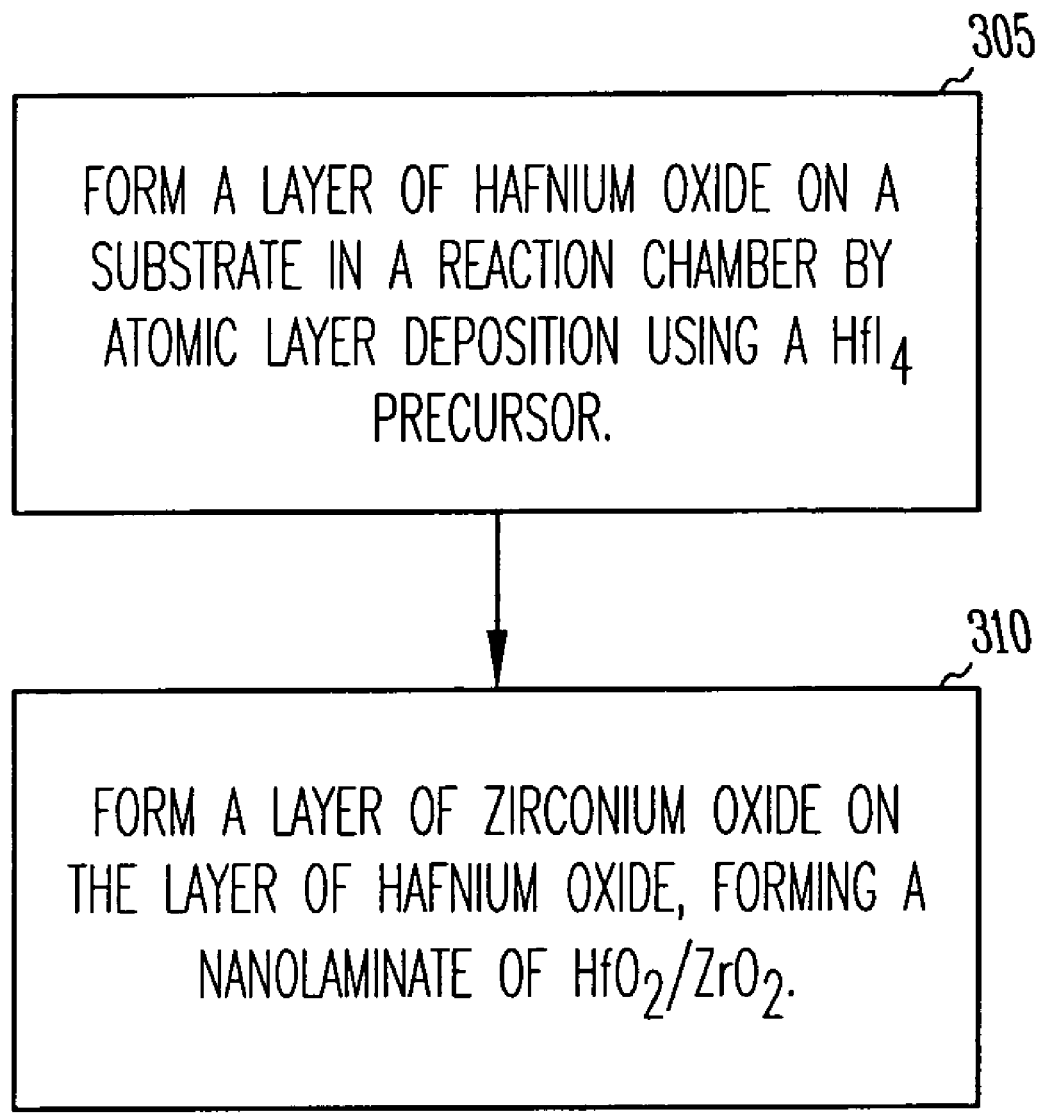
FIG. 3 illustrates a flow diagram of elements for an embodiment of a method to process a nanolaminate of $HfO_2/ZrO_2$, according to the teachings of the present invention.

FIG. 3 illustrates a flow diagram of elements for an embodiment of a method to process a nanolaminate of $HfO_2/ZrO_2$, according to the teachings of the present invention. This embodiment of a method for forming a $HfO_2/ZrO_2$ nanolaminate includes forming a layer of hafnium oxide on a substrate in a reaction chamber by atomic layer deposition using a $HfI_4$ precursor, at block 305, and forming a layer of zirconium oxide on the layer of hafnium oxide to form a $HfO_2/ZrO_2$ composite, at block 310. By strictly controlling the processing of the $HfO_2$ layer and the $ZrO_2$ layer, the $HfO_2/ZrO_2$ composite formed is a $HfO_2/ZrO_2$ nanolaminate. In one embodiment, the $HfO_2/ZrO_2$ nanolaminate is composed of one $HfO_2$ layer and one layer $ZrO_2$ layer. In another embodiment, the $HfO_2/ZrO_2$ nanolaminate includes multiple layers of the $HfO_2/ZrO_2$ composite, where the initial layer disposed on a substrate is a $HfO_2$ layer. After this initial $HfO_2$ layer, there are alternating layers of $HfO_2$ and $ZrO_2$, with the terminating layer being a $ZrO_2$ layer in one embodiment and $HfO_2$ layer in another embodiment.

Forming the $HfO_2$ layer on a substrate by atomic layer deposition involves using a deposition sequence including pulsing the $HfI_4$ precursor into the reaction chamber, followed by pulsing a purging gas, pulsing a first oxygen containing precursor, and pulsing the purging gas. In one embodiment, the first oxygen precursor is water vapor. Each precursor is pulsed for a short time ranging from 0.5 seconds to two or three seconds. A purging gas such as nitrogen is pulsed for a longer period such as five to fifteen seconds to insure that all excess precursor gases and by-products are removed from the reaction chamber. Pulsing times are selected to enable the controlled growth of the $HfO_2$ layer on a one to two monolayer basis. For a fixed ALD sequence or cycle, including fixed pulsing times and substrate temperatures, the $HfO_2$ layer growth rate is at a relatively fixed rate, where a desired thickness of the $HfO_2$ layer is obtained by performing the ALD sequence for a predetermined number of cycles.

Figure 4:
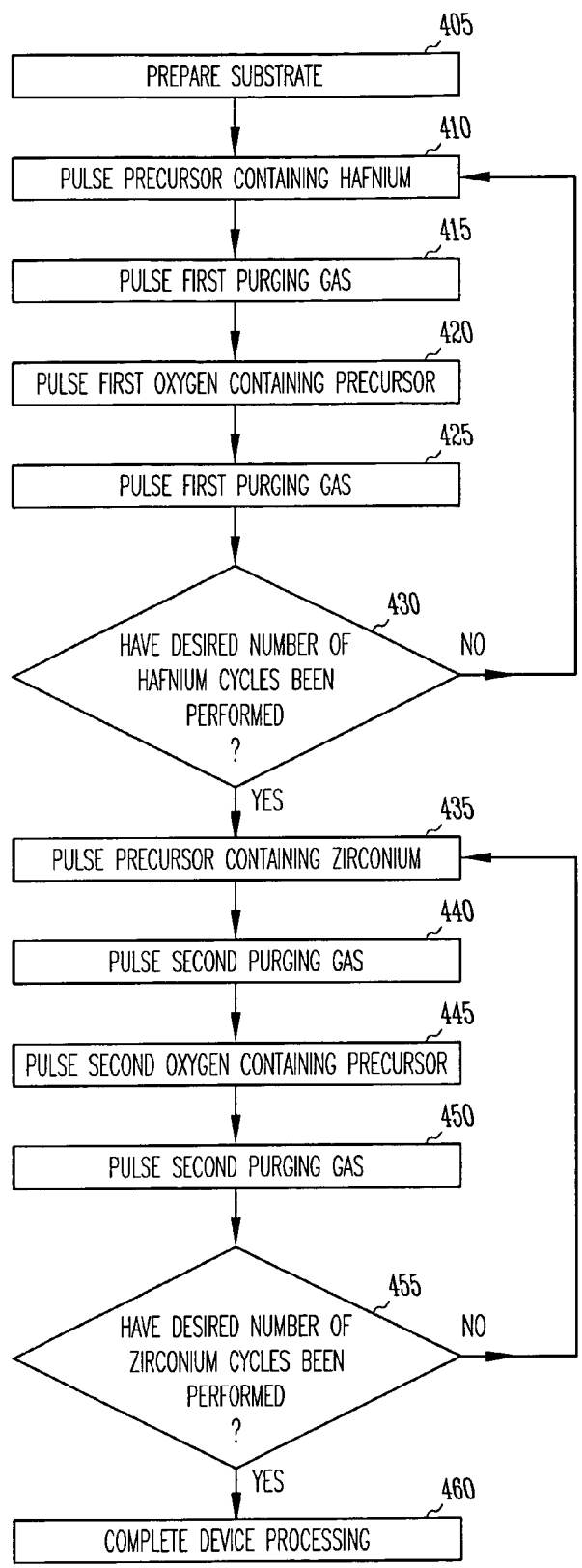
FIG. 4 illustrates a flow diagram of elements for another embodiment of a method to process a nanolaminate of $HfO_2/ZrO_2$ by atomic layer deposition, according to the teachings of the present invention.

FIG. 4 illustrates a flow diagram of elements for another embodiment of a method to process a nanolaminate of $HfO_2/ZrO_2$ by atomic layer deposition, according to the teachings of the present invention. In this embodiment, a method for forming a dielectric film includes forming a layer of $HfO_2$ on a substrate in a reaction chamber by atomic layer deposition using a $HfI_4$ precursor, and forming a layer of $ZrO_2$ on the $HfO_2$ layer by atomic layer deposition to form a $HfO_2/ZrO_2$ composite. Using the ALD process provides for the formation of the $HfO_2/ZrO_2$ composite as a nanolaminate. An embodiment of this method can be implemented with the atomic layer deposition system of FIGS. 2A,B.

At block 405, a substrate is prepared. The substrate used for forming a transistor is typically a silicon or silicon containing material. In other embodiments, germanium, gallium arsenide, silicon-on-sapphire substrates, or other suitable substrates may be used. This preparation process includes cleaning of the substrate 210 and forming layers and regions of the substrate, such as drains and sources of a metal oxide semiconductor (MOS) transistor, prior to forming a gate dielectric. The sequencing of the formation of the regions of the transistor being processed follows typical sequencing that is generally performed in the fabrication of a MOS transistor as is well known to those skilled in the art. Included in the processing prior to forming a gate dielectric is the masking of substrate regions to be protected during the gate dielectric formation, as is typically performed in MOS fabrication. In this embodiment, the unmasked region includes a body region of a transistor, however one skilled in the art will recognize that other semiconductor device structures may utilize this process. Additionally, the substrate 210 in its ready for processing form is conveyed into a position in reaction chamber 220 for ALD processing.

At block 410, a precursor containing hafnium is pulsed into reaction chamber 220. In particular, $HfI_4$ is used as a source material. The $HfI_4$ is pulsed into reaction chamber 220 through the gas-distribution fixture 240 onto substrate 210. The flow of the $HfI_4$ is controlled by mass-flow controller 256 from gas source 251. In one embodiment, the substrate temperature is maintained between about 225° C. and about 500° C. In another embodiment, the substrate temperature is maintained between about 250° C. and about 325° C. The lower temperature allows for forming a dielectric film suited for use as a gate dielectric, since an amorphous layer tends to more readily form at lower processing temperatures. The $HfI_4$ reacts with the surface of the substrate 210 in the desired region defined by the unmasked areas of the substrate 210.

At block 415, a first purging gas is pulsed into the reaction chamber 220. In particular, pure nitrogen with a purity greater than 99.99% is used as a purging gas for $HfI_4$. The nitrogen flow is controlled by mass-flow controller 266 from the purging gas source 261 into the gas conduit 270. Using the pure nitrogen purge avoids overlap of the precursor pulses and possible gas phase reactions. A nitrogen gas can also be used as a carrier gas for the precursors. Following the purge, a first oxygen containing precursor is pulsed into the reaction chamber 220, at block 420. For the hafnium sequence using $HfI_4$ as the precursor, water vapor is selected as the precursor acting as an oxidizing reactant to form a $HfO_2$ on the substrate 210. Alternately, a vapor solution of $H_2O$—$H_2O_2$ can be used as the oxygen containing precursor. The water vapor is pulsed into the reaction chamber 220 through gas conduit 270 from gas source 252 by mass-flow controller 257. The water vapor aggressively reacts at the surface of substrate 210.

Following the pulsing of oxidizing reactant water vapor, the first purging gas is injected into the reaction chamber 220, at block 425. In the $HfI_4$ water vapor sequence, pure nitrogen gas is used to purge the reaction chamber after pulsing each precursor gas. Excess precursor gas, and reaction by-products are removed from the system by the purge gas in conjunction with the exhausting of the reaction chamber 220 using vacuum pump 282 through mass-flow controller 287, and exhausting of the gas conduit 270 by the vacuum pump 281 through mass-flow controller 286.

During the $HfI_4$/water vapor sequence, the substrate is held between about 250° C. and about 325° C. by the heating element 230. In other embodiments the substrate is held between about 225° C. and 500° C. The $HfI_4$ pulse time ranges from about 1.0 sec to about 2.0 sec. After the $HfI_4$ pulse, the hafnium sequence continues with a purge pulse followed by a water vapor pulse followed by a purge pulse. In one embodiment, performing a purge pulse followed by a water vapor pulse followed by a purge pulse takes about 2 seconds. In another embodiment, each pulse in the hafnium sequence has a 2 second pulse period. In another embodiment, the pulse periods for the precursors are 2 seconds, while the purge gas pulse period ranges from five second to twenty seconds.

At block 430, a determination is made as to whether a desired thickness of the $HfO_2$ layer has been formed. The thickness of a $HfO_2$ film after one cycle is determined by a fixed growth rate for the pulsing periods and precursors used in the hafnium sequence, set at a value such as N nm/cycle. For a desired $HfO_2$ film thickness, t, in an application such as forming a gate dielectric of a MOS transistor, the ALD process should be repeated for t/N cycles. The desired thickness should be attained after t/N cycles. If less than t/N cycles have been completed, the process starts over at block 410 with the pulsing of the precursor containing hafnium, which in the embodiment discussed above is a $HfI_4$ gas. If t/N cycles have completed, no further ALD processing of $HfO_2$ is required and the $HfO_2$ layer is ready to be formed as a composite with a $ZrO_2$ layer.

At block 435, a precursor containing zirconium is pulsed into the reaction chamber 220. In one embodiment, $ZrI_4$ is used as the zirconium containing precursor. In another embodiment, $ZrCl_4$ is used as the zirconium containing precursor. The $ZrI_4$ is evaporated from a containment area held at about 250° C. in gas source 253. It is pulsed to the surface of the substrate 210 through gas-distribution fixture 240 from gas source 253 by mass-flow controller 258. The $ZrI_4$ is introduced onto the $HfO_2$ layer that was formed during the $HfI_4$/water vapor sequence.

At block 440, a second purging gas is introduced into the system. For a $ZrI_4$ precursor, nitrogen gas is used as a purging and carrier gas. The nitrogen flow is controlled by mass-flow controller 267 from the purging gas source 262 into the gas conduit 270 and subsequently into the reaction chamber 220. Following the nitrogen purge, at block 445, a second oxygen containing precursor is pulsed into the reaction chamber 220. For the zirconium sequence using $ZrI_4$ as the precursor, a vapor solution of $H_2O$—$H_2O_2$ is selected as the precursor acting as an oxidizing reactant to interact with the zirconium deposited on the $HfO_2$ layer on the substrate 210. The $H_2O$—$H_2O_2$ vapor solution is pulsed into the reaction chamber 220 through gas conduit 270 from gas source 254, held at about room temperature, by mass-flow controller 259. The $H_2O$—$H_2O_2$ vapor solution aggressively reacts at the surface of substrate 210 to form a $ZrO_2$ layer.

Following the pulsing of the $H_2O$—$H_2O_2$ vapor solution acting as an oxidizing reactant, the nitrogen purging gas is injected into the reaction chamber 200, at block 450. In the $ZrI_4$/$H_2O$—$H_2O_2$ vapor solution sequence, nitrogen gas is used to purge the reaction chamber after pulsing each precursor gas. In another embodiment, argon gas is used as the purging gas. Excess precursor gas, and reaction by-products are removed from the system by the purge gas in conjunction with the exhausting of the reaction chamber 220 using vacuum pump 282 through mass-flow controller 287, and exhausting of the gas conduit 270 by the vacuum pump 281 through mass-flow controller 286.

During the $ZrI_4$/$H_2O$—$H_2O_2$ vapor solution sequence, the substrate is held between about 250° C. and about 325° C. by the heating element 230. In other embodiments, the substrate is held between about 275° C. and about 500° C. In one embodiment, the process pressure is maintained at about 250 Pa during the zirconium sequence. Pulse times for the $ZrI_4$ and the $H_2O$—$H_2O_2$ vapor solution were about 2 sec for both precursors, with purging pulse times of about 2 secs.

At 455, similar to the $HfO_2$ layer formation, a determination is made as to whether the $ZrO_2$ layer has the desired thickness by determining if a desired number of zirconium cycles have been performed. If the number of zirconium cycles performed is less than the number needed to form the desired thickness, the zirconium containing precursor is pulsed into the reaction chamber, at block 435, and the process continues. If the desired number of zirconium cycles has been performed, this completes not only the $ZrI_4$/$H_2O$—$H_2O_2$ vapor solution sequence, but it also completes a hafnium sequence/zirconium sequence cycle forming a $HfO_2$/$ZrO_2$ nanolaminate.

Upon completing the formation of the $HfO_2$/$ZrO_2$ nanolaminate, the nanolaminate can be annealed. The annealing can be performed at a temperature between about 300° C. and about 800° C. in an inert or nitrogen atmosphere.

At block 460, after forming the $HfO_2$/$ZrO_2$ nanolaminate, processing the device containing the $HfO_2$/$ZrO_2$ nanolaminate is completed. In one embodiment, completing the device includes completing the formation of a transistor. Alternately, completing the process includes completing the construction of a memory device having a array with access transistors formed with gate dielectrics containing $HfO_2$/$ZrO_2$ nanolaminates. Further, in another embodiment, completing the process includes the formation of an electronic system including an information handling device that uses electronic devices with transistors formed with gate dielectrics containing $HfO_2$/$ZrO_2$ nanolaminates. Typically, information handling devices such as computers include many memory devices, having many access transistors.

In one embodiment, a $HfO_2/ZrO_2$ nanolaminate includes one $HfO_2$ layer and one $HfO_2/ZrO_2$ layer. The completed $HfO_2/ZrO_2$ nanolaminate has a thickness in which the thickness of the $HfO_2$ layer is about one-half the thickness of the completed $HfO_2ZrO_2$ nanolaminate. In another embodiment, a completed $HfO_2/ZrO_2$ nanolaminate includes multiple alternating layers of $HfO_2$ and $ZrO_2$, which requires that at block 455, once a given $ZrO_2$ layer has been formed with a desired thickness, a hafnium sequence is then started at block 410. This process, proceeding from completing the zirconium sequence at block 455 to starting the hafnium sequence at block 410, continues until the desired number of alternating layers of $HfO_2$ and $ZrO_2$ have been formed. The $HfO_2/ZrO_2$ nanolaminate formation begins with forming a $HfO_2$ layer, but may end with forming $ZrO_2$ layer or a $HfO_2$ layer. ALD provides for the engineering of a $HfO_2/ZrO_2$ nanolaminate. For example, nanolaminates can be formed with n number of $HfO_2/ZrO_2$ composite layers where the $HfO_2$ layer is formed with x number of hafnium cycles and y number of zirconium cycles. Alternately, nanolaminates can be formed with n number of $HfO_2/ZrO_2$ composite layers where the first composite layer has a $HfO_2$ layer formed with $x_1$ number of hafnium cycles and $y_1$ number of zirconium cycles, a second composite layer has a $HfO_2$ layer formed with $x_2$ number of hafnium cycles and $y_2$ number of zirconium cycles, extended to the $n^{th}$ composite layer having a $HfO_2$ layer formed with $x_n$ number of hafnium cycles and $y_n$ number of zirconium cycles. Such tailoring of the $HfO_2/ZrO_2$ nanolaminate provides for forming dielectric films with a designed physical thickness, t, and equivalent oxide thickness, $t_{eq}$.

In the hafnium sequence and in the zirconium sequence, pulsing each precursor into the reaction chamber is controlled for a predetermined period, the predetermined period being individually controlled for each precursor pulsed into the reaction chamber. Additionally, the substrate is maintained at a selected temperature for forming each layer, where the selected temperature set independently for forming each layer.

In a recent article by O. Sneh et al., *Thin Solid Films*, vol. 402, pp. 248-261 (2002), atomic layer deposition of thin films was discussed. The article noted that the growth rate for $HfO_2$ is, typically, about 0.8 Å/cycle. Similarly, in a recent article by K. Kukli et al., *Journal of the Electrochemical Society*, vol. 148, no. 12. pp. F227-F232 (2001), dealing with $ZrO_2$ formed by ALD using $ZrI_4$, it was noted that at about a growth temperature of about 300° C., $ZrO_2$ growth rate was about 0.075 nm/cycle. Thus, in the embodiments for forming $HfO_2/ZrO_2$ nanolaminates using ALD for all composite layers, each material layer can be grown at about 0.75-0.80 Å/cycle.

Figure 5:
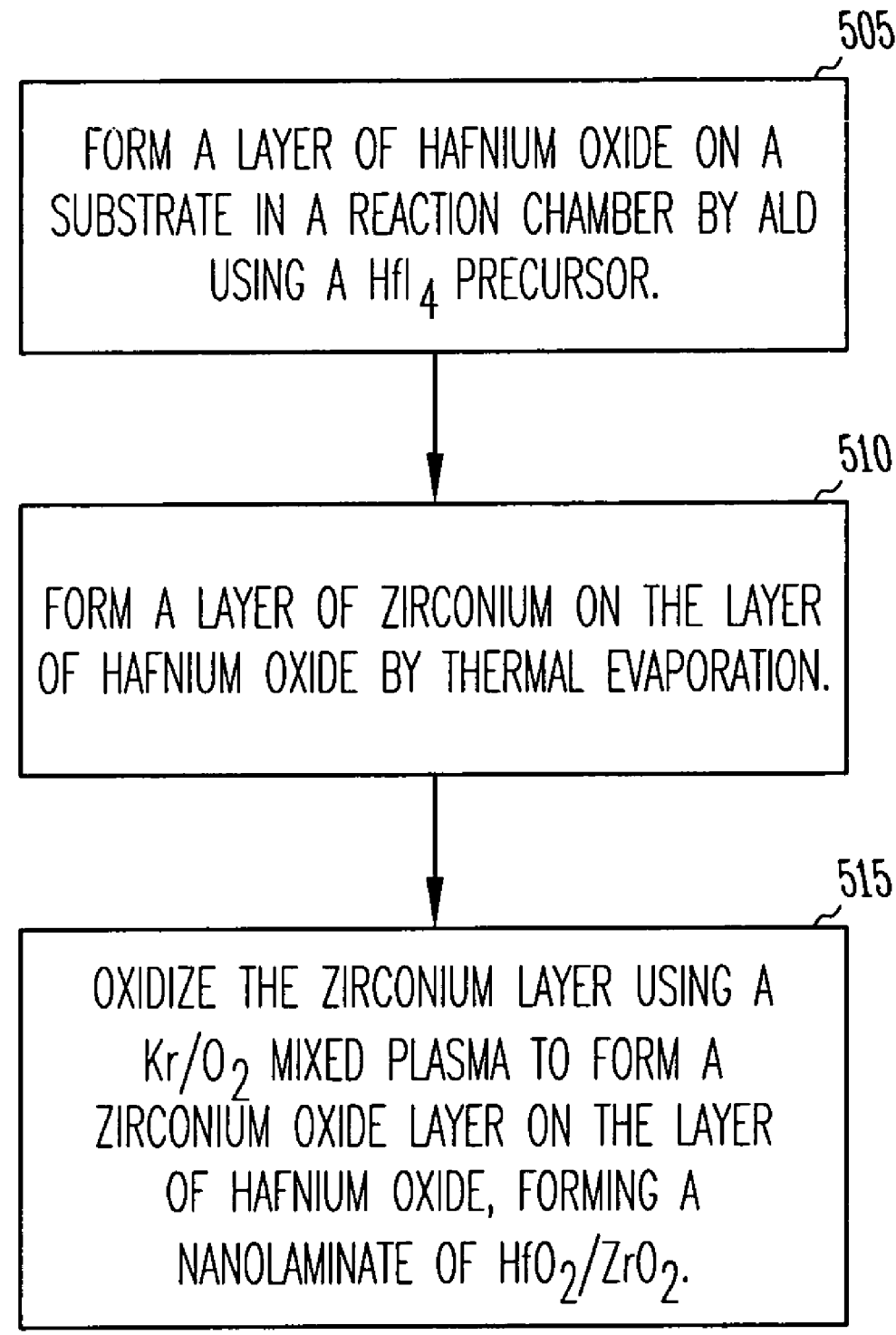
FIG. 5 illustrates a flow diagram of elements for an embodiment of a method to process a nanolaminate of $HfO_2/ZrO_2$ using atomic layer deposition and thermal evaporation/plasma oxidation, according to the teachings of the present invention.

FIG. 5 illustrates a flow diagram of elements for an embodiment of a method to process a nanolaminate of $HfO_2/ZrO_2$ using atomic layer deposition and thermal evaporation/plasma oxidation, according to the teachings of the present invention. In one embodiment, a nanolaminate of $HfO_2/ZrO_2$ is formed by a method that includes forming a layer of hafnium oxide on a substrate in a reaction chamber by atomic layer deposition using a $HfI_4$ precursor, at block 505, forming a layer of zirconium on the layer of hafnium oxide by thermal evaporation, at block 510, and oxidizing the zirconium layer using a krypton(Kr)/oxygen($O_2$) mixed plasma to form a $HfO_2/ZrO_2$ composite, at block 515. The $HfO_2/ZrO_2$ composite is a nanolaminate, whose thickness can be controlled by precisely controlling the ALD formation of $HfO_2$, and thermal deposition of zirconium. In one embodiment, the thermal evaporation of zirconium is performed using electron beam evaporation.

Figure 6:
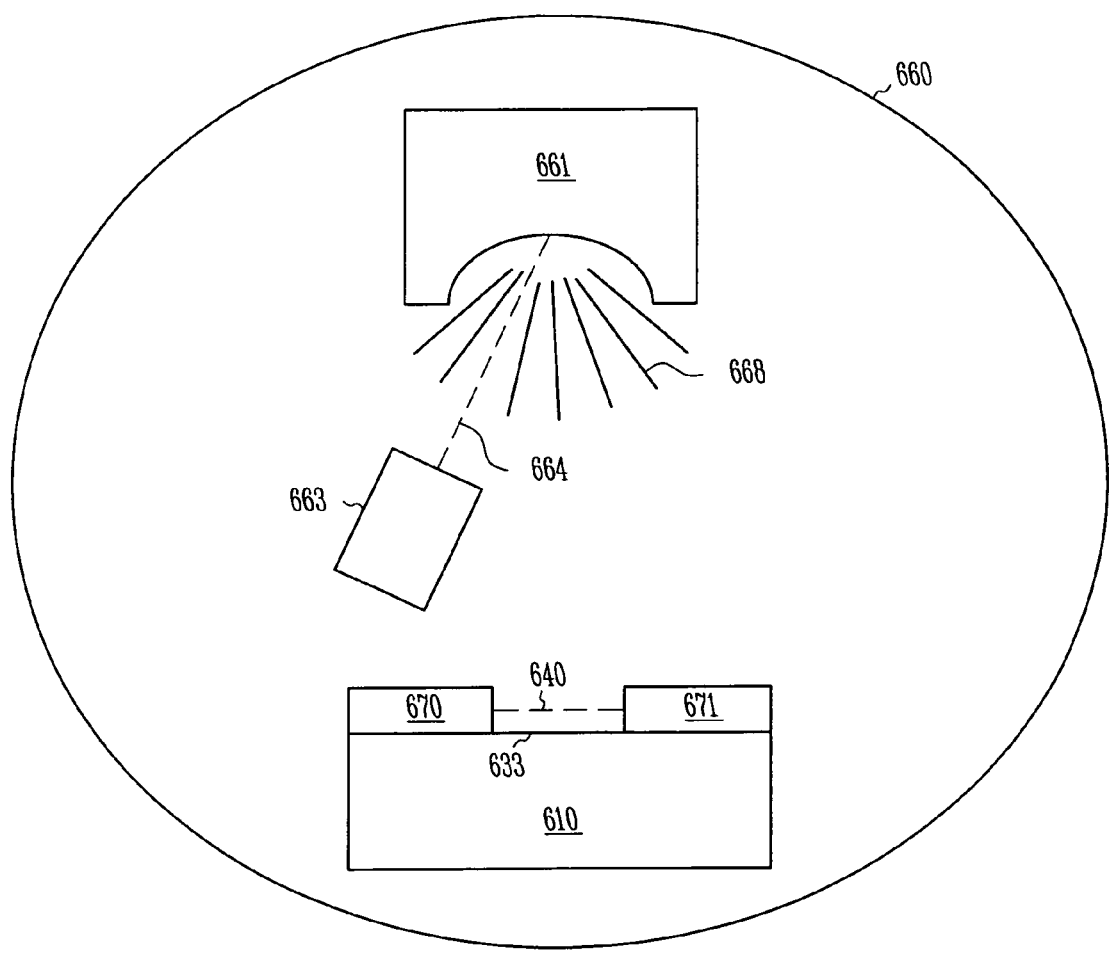
FIG. 6 shows an embodiment of an electron beam evaporation process for forming a layer of zirconium on a layer of $HfO_2$ to process a nanolaminate of $HfO_2/ZrO_2$, according to the teachings of the present invention.

FIG. 6 shows an embodiment of an electron beam evaporation process for forming a layer of zirconium on a layer of $HfO_2$ to process a nanolaminate of $HfO_2/ZrO_2$, according to the teachings of the present invention. In the embodiment of FIG. 6, a substrate 610 is located inside a deposition chamber 660. The substrate in this embodiment is masked by a first masking structure 670 and a second masking structure 671. In this embodiment, the unmasked region 633 includes a body region of a transistor on which a layer of $HfO_2$ is formed. However one skilled in the art will recognize that other semiconductor device structures may utilize this process. Also located within the deposition chamber 660 is an electron gun 663 and a target 661. The electron gun 663 provides an electron beam 664 directed at target 661 containing a source material for forming $ZrO_2$ on the unmasked region $HfO_2$ layer 633 of the substrate 610. The electron gun 663 includes a rate monitor for controlling the rate of evaporation of the material in the target 661 at which the electron beam 664 is directed. For convenience, control displays and necessary electrical connections as are known to those skilled in the art are not shown in FIG. 6.

During the evaporation process, the electron gun 663 generates an electron beam 664 that hits target 661. In one embodiment, target 661 contains a zirconium metal source, which is evaporated due to the impact of the electron beam 664. The evaporated material 668 is then distributed throughout the chamber 660. A layer of zirconium is grown forming a film 640 on the surface of the $HfO_2$ layer 633 on substrate 610, which is maintained at a temperature between 150° C. and 200° C. The growth rate can vary with a typical rate of 0.1 Å/s. After depositing a zirconium layer on the $HfO_2$ layer 633, the zirconium layer is oxidized.

The evaporation chamber 660 can be included as part of an overall processing system including ALD system 200 of FIG. 2. To avoid contamination of the surface of the $HfO_2$ layer 633, evaporation chamber 660 can be connected to ALD system 200 using sealable connections to maintain the substrate, which is substrate 210 in FIG. 2 and substrate 610 of FIG. 6, in an appropriate environment between ALD processing of the $HfO_2$ layer and Zr evaporation. Other means as are known to those skilled in the art can be employed for maintaining an appropriate environment between different processing procedures.

Figure 7A:
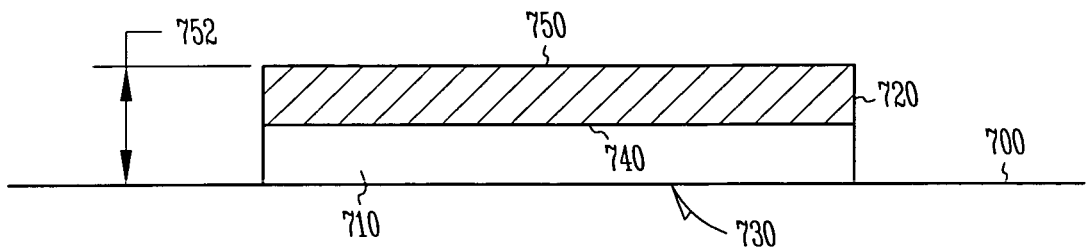
FIG. 7A shows an embodiment of a zirconium layer deposited on a layer of $HfO_2$, according to the teachings of the present invention.
Figure 7B:
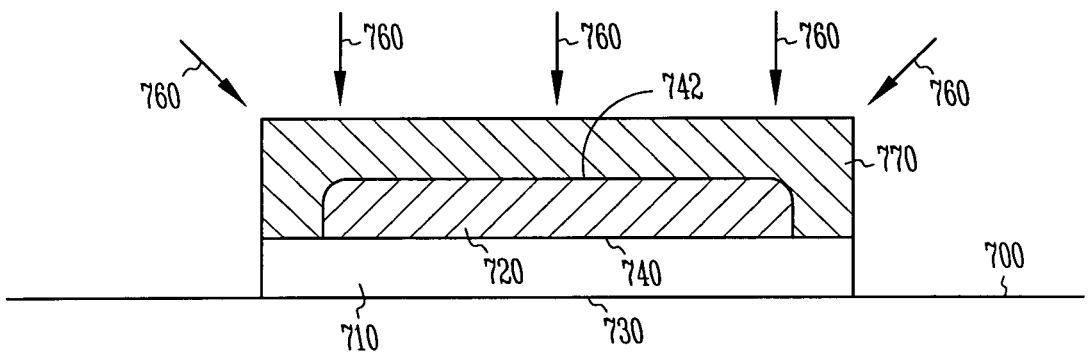
FIG. 7B shows an embodiment of a partially oxidized zirconium layer deposited on a layer of $HfO_2$, according to the teachings of the present invention.
Figure 7C:
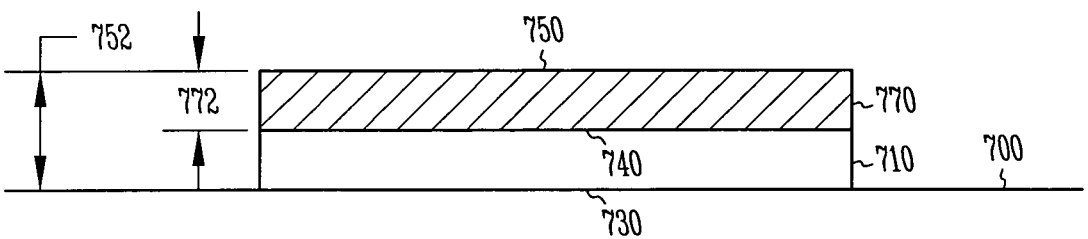
FIG. 7C shows an embodiment of a ZrO$_2$ substantially completely oxidized and formed on a layer of HfO$_2$ to form a nanolaminate of HfO$_2$/ZrO$_2$, according to the teachings of the present invention.

FIGS. 7A-7C show a low temperature oxidation process that is used in one embodiment to form a layer of $ZrO_2$ on a layer of $HfO_2$. FIG. 7A shows an embodiment of a zirconium layer 720 deposited on a $HfO_2$ layer 710, according to the teachings of the present invention. The $HfO_2$ layer 710 is formed on substrate 700 using an ALD process, as previously discussed, having an substrate interface 730. The Zr layer 720 is deposited on the $HfO_2$ layer 710 by electron beam evaporation, as discussed above, forming an interface 740 with the $HfO_2$ layer 710 and having an outer surface 750. The combined film with the Zr layer 720 deposited on the $HfO_2$ layer 710 has a total thickness 752. The layers 710, 720 are deposited over a body region of a transistor, however the layers may be deposited on any surface within the scope of the invention.

FIG. 7B shows an embodiment of a partially oxidized zirconium layer 770 deposited on a $HfO_2$ layer 710, according to the teachings of the present invention. In FIG. 7B, the layer 720 is in the process of being oxidized. In one embodiment, the oxidation process includes a krypton/oxygen mixed plasma oxidation process. The mixed plasma process generates atomic oxygen or oxygen radicals in contrast to molecular oxygen or $O_2$ used in conventional thermal oxidation. The atomic oxygen is introduced to the layer from all exposed directions as indicated by arrows 760, creating an oxide portion 770. The atomic oxygen continues to react with the layer and creates an oxidation interface 742. As the reaction progresses, atomic oxygen diffuses through the oxide portion 770 and reacts at the oxidation interface 742 until the layer is completely converted to an oxide of the deposited material layer.

FIG. 7C shows an embodiment of a $ZrO_2$ substantially completely oxidized and formed on a layer of $HfO_2$ to form a nanolaminate of $HfO_2/ZrO_2$, according to the teachings of the present invention. FIG. 7C shows the resulting oxide layer 770 which spans a physical thickness 772 from the outer surface 750 to the interface 740. The overall thickness 752 of the $HfO_2/ZrO_2$ composite in FIG. 7C has increased from that of the Zr layer deposited on the $HfO_2$ layer in FIG. 7A, due to the oxidation of the zirconium.

In an embodiment, the processing variables for the mixed plasma oxidation include a low ion bombardment energy of less than 7 eV, a high plasma density above $10^{12}/cm^3$ and a low electron temperature below 1.3 eV. In another embodiment, the substrate temperature is approximately 400° C. In another embodiment, a mixed gas of 3% oxygen with the balance being krypton at a pressure of 1 Torr is used. In one embodiment, a microwave power density of 5 $W/cm^2$ is used. The oxidation process provides a growth rate of 1.5 nm/min.

The low temperature mixed plasma oxidation process described above allows the deposited layer to be oxidized at a low temperature. The mixed plasma process in one embodiment is performed at approximately 400° C. in contrast to prior thermal oxidation processes that are performed at approximately 1000° C.

Figure 8:
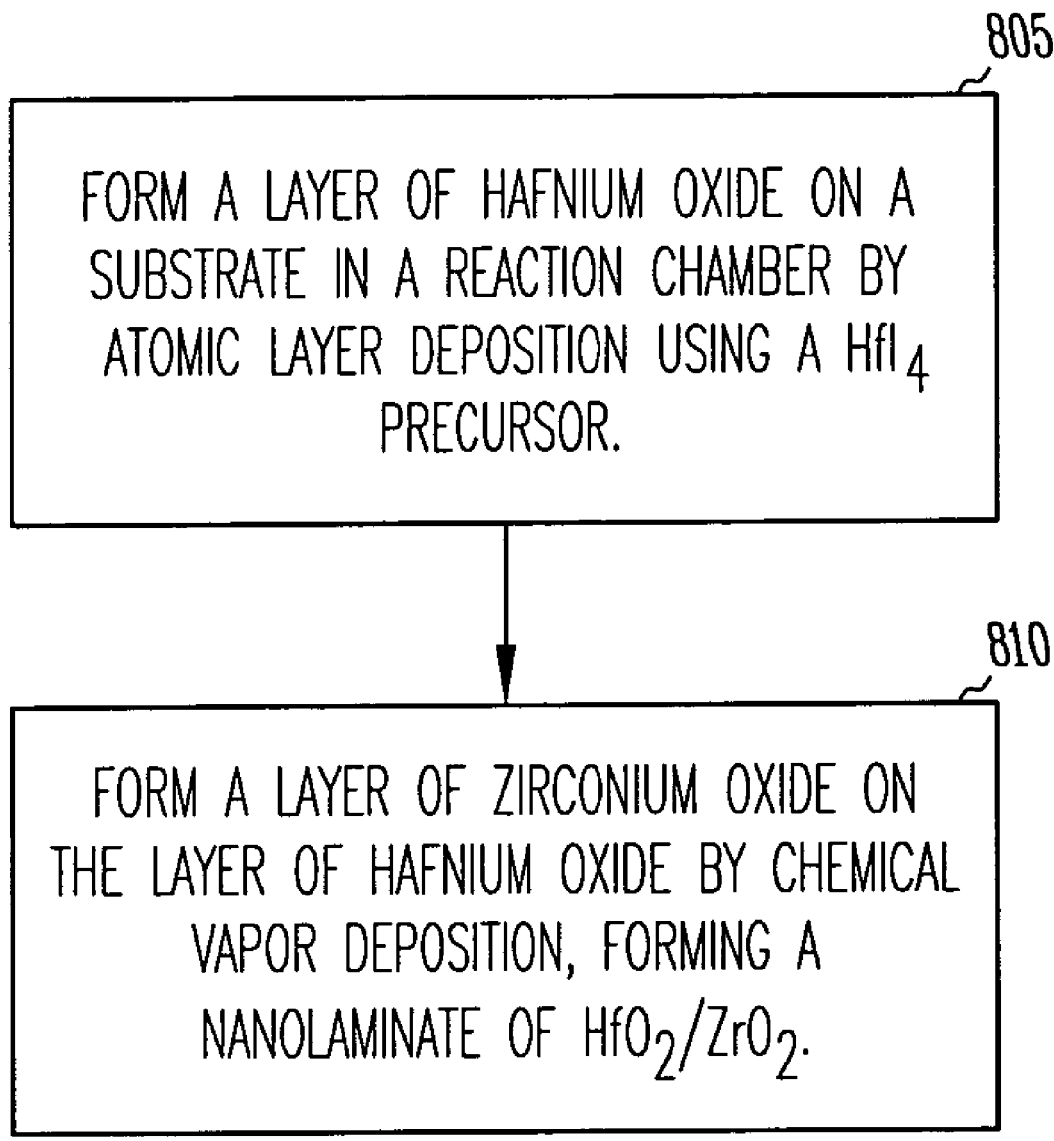
FIG. 8 illustrates a flow diagram of elements for an embodiment of a method to process a nanolaminate of HfO$_2$/ZrO$_2$ using atomic layer deposition and chemical vapor deposition, according to the teachings of the present invention.

FIG. 8 illustrates a flow diagram of elements for an embodiment of a method to process a nanolaminate of $HfO_2/ZrO_2$ using atomic layer deposition and chemical vapor deposition (CVD), according to the teachings of the present invention. This embodiment of the method includes forming a layer of hafnium oxide on a substrate in a reaction chamber by atomic layer deposition using a $HfI_4$ precursor, at block 805, and forming a layer of zirconium oxide on the layer of hafnium oxide by chemical vapor deposition to form a $HfO_2/ZrO_2$ composite, at block 810. The $HfO_2$ layer is formed by ALD as discussed in the embodiments above. In one embodiment, the $ZrO_2$ layer is formed by rapid thermal CVD at about 500° C. Subsequently, a nitrogen anneal is performed between about 700° C. and about 800° C. for about 30 sec. A rapid thermal CVD system, as is known to those skilled in the art, is used to form the $ZrO_2$ layer.

Figure 9:
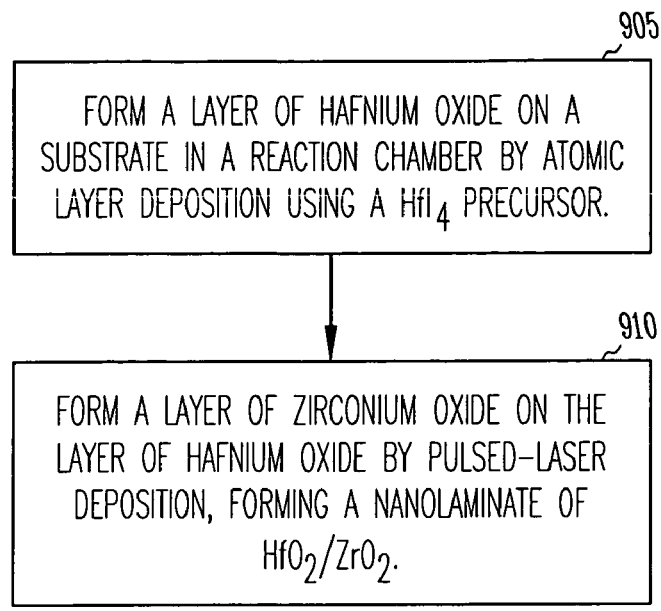
FIG. 9 illustrates a flow diagram of elements for an embodiment of a method to process a nanolaminate of HfO$_2$/ZrO$_2$ using atomic layer deposition and pulsed-laser deposition, according to the teachings of the present invention.

FIG. 9 illustrates a flow diagram of elements for an embodiment of a method to process a nanolaminate of $HfO_2/ZrO_2$ using atomic layer deposition and pulsed-laser deposition, according to the teachings of the present invention. This embodiment of the method includes forming a layer of hafnium oxide on a substrate in a reaction chamber by atomic layer deposition using a $HfI_4$ precursor, at block 905, and forming a layer of zirconium oxide on the layer of hafnium oxide by pulsed-laser deposition to form a $HfO_2/ZrO_2$ composite, at block 910. The $HfO_2$ layer is formed by ALD as discussed in the embodiments above. A pulsed-laser deposition system is similar to the electron beam evaporation system 660 of FIG. 6 with the electron gun 663 replaced by a laser and focusing optics, though the laser and focusing optics need not be located in the evaporation reaction chamber. A beam from the laser is focused on a target, which causes an ablation of material from the target. The material removed from the target deposits on an unmasked $HfO_2$ layer located on a substrate. Controlling the focusing of the beam from the laser on the source target provides for precision growth rate of the $ZrO_2$ layer.

In one embodiment, a substrate temperature is maintained between about 200° C. to about 800° C. during pulsed-laser deposition. A beam from a laser source such as a excimer laser is focused on a rotating zirconium target source in a deposition chamber with an $O_2$ pressure of about 0.2 Torr to form a $ZrO_2$ layer on a $HfO_2$ layer. Other laser sources and configurations can be used as is known by those skilled in the art.

Figure 10:
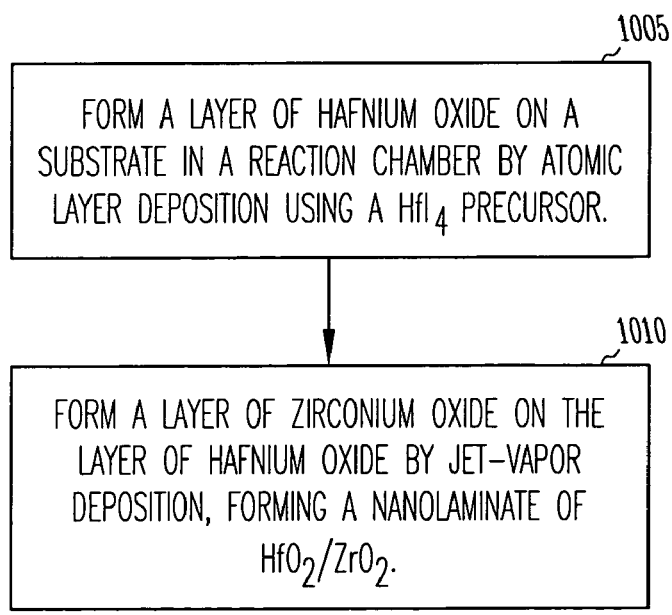
FIG. 10 illustrates a flow diagram of elements for an embodiment of a method to process a nanolaminate of HfO$_2$/ZrO$_2$ using atomic layer deposition and jet-vapor deposition, according to the teachings of the present invention.

FIG. 10 illustrates a flow diagram of elements for an embodiment of a method to process a nanolaminate of $HfO_2/ZrO_2$ using atomic layer deposition and jet-vapor deposition, according to the teachings of the present invention. This embodiment of the method includes forming a layer of hafnium oxide on a substrate in a reaction chamber by atomic layer deposition using a $HfI_4$ precursor, at block 1005, and forming a layer of zirconium oxide on the layer of hafnium oxide by jet-vapor deposition to form a $HfO_2/ZrO_2$ composite, at block 1010. The $HfO_2$ layer is formed by ALD as discussed in the embodiments above. The $ZrO_2$ layer can be formed using jet-vapor deposition techniques as is known to those skilled in the art.

In one embodiment, the jet-vapor deposition zirconium and oxygen vapors are directed to the $HfO_2$ layer out of source nozzles by supersonic Ar jets. Using jet-vapor deposition in a low pressure atmosphere allows for forming the $ZrO_2$ layer at room temperature. In one embodiment, annealing is performed subsequent to forming the $ZrO_2$ layer at a about 800° C. In one embodiment, the annealing is performed using a nitrogen rapid thermal annealing (RTA). The annealing can be performed after each $ZrO_2$ layer is formed in the composite of alternating layers of the $HfO_2/ZrO_2$ nanolaminate and/or at the completion of the $HfO_2/ZrO_2$ nanolaminate.

In each of the various embodiments for forming $ZrO_2$ layers, the $HfO_2/ZrO_2$ nanolaminates can be annealed in a temperature range from between 300° C. to 800° C. Typically the annealing is for a short time and in performed in a nitrogen atmosphere or in some other inert atmosphere.

Bulk layers of $HfO_2$ and bulk layers of $ZrO_2$ both have a dielectric constant of about 25. Consequently, a material film composed of bulk layers of $HfO_2$ and $ZrO_2$ will also have a dielectric constant of about 25. However, thin layers of a material, typically, have dielectric constants somewhat less than their bulk counterparts. The reduced value of the dielectric constants for ultra thin material films is due in part to the formation of an interfacial layer between the material film and the substrate. Some materials formed on silicon substrates form a $SiO_2$ interfacial layer, while other materials form an silicide interfacial layer. The material silicide in many cases will have a dielectric greater than $SiO_2$, but less than the bulk material dielectric constant. $ZrO_2$ formed on silicon substrates may result in an interfacial region where silicon diffuses through a layer of $ZrO_2$ to form a poly-silicon/$ZrO_2$/silicon interfacial region, as reported by C. H. Lee et al., *IEDM* 2000, 27-30 (2000). Further, nanolaminates of $ZrO_2/HfO_2$ were reported to have $SiO_2$ interfacial layer when formed by ALD using $ZrCl_4$ and $HfCl_4$ precursors. See H. Zhang et al., *Journal of the Electrochemical Society*, vol. 148, no. 4, pp. F63-F66 (2001). To eliminate the $SiO_2$ interfacial layer, Zhang et al. grew $ZrO_2/HfO_2$ nanolaminates on nitrated Si substrates producing dielectric constants ranging from 9 to 14 with low leakage currents ranging from $2.2 \times 10^{-6}$ to $1.2 \times 10^{-8}$ $A/cm^3$ at 1 MV/cm.

In the various embodiments according to the teachings of the present invention, $HfO_2/ZrO_2$ nanolaminates are formed by ALD of $HfO_2$ on substrates using a $HfI_4$ precursor. Subsequently, a layer of $ZrO_2$ is formed on the $HfO_2$ layer by various deposition techniques. These $HfO_2/ZrO_2$ nanolaminates form a stable interface with a silicon substrate. Using ALD, the size and effect of interfacial layer between the silicon substrate and the first $HfO_2$ layer will depend on the reactivity of the $HfO_2$ in forming an abrupt transition from silicon surface to $HfO_2$ layer. Consequently, dielectric films containing $HfO_2/ZrO_2$ nanolaminates can have dielectric constants ranging from 9 or 10 to 25. Additionally, forming the $HfO_2$ layer at relatively low temperatures provides a means for enabling the formation of $HfO_2/ZrO_2$ nanolaminates that are amorphous.

Another factor setting a lower limit for the scaling of a dielectric layer is the number of monolayers of the dielectric structure necessary to develop a full band gap such that good insulation is maintained between an underlying silicon layer and an overlying conductive layer on the dielectric layer or film. This requirement is necessary to avoid possible short circuit effects between the underlying silicon layer and the overlying conductive layer used. In one embodiment, for several $HfO_2$ monolayers and several $ZrO_2$ monolayers forming a nanolaminate, an expected lower limit for the physical thickness of a dielectric layer grown by forming $HfO_2/ZrO_2$ nanolaminates is anticipated to be in about the 2-4 nm range. Consequently, typical dielectric layers or films can be grown by forming $HfO_2/ZrO_2$ nanolaminates having physical thickness in the range of 4 to 10 nm. $HfO_2$ used as the initial layer is expected to provide excellent overall results with respect to reliability, current leakage, and ultra-thin $t_{eq}$. Further, using ALD for processing all layers of a $HfO_2/ZrO_2$ nanolaminate, the transitions between such oxide layers can be engineered to be abrupt or graded. Thus, the number of layers used, the thickness of each layer, and the nature of the interface between each layer can be engineered to provide the desired electrical characteristics.

With $HfO_2$ layers formed by ALD and $ZrO_2$ layers formed according to one of the various embodiments described herein, $HfO_2/ZrO_2$ nanolaminates can have a wide range of thicknesses and dielectric constants. The physical thicknesses can range from about 2 nm to about 10 nm with typical thickness ranging from about 4 nm to about 10 nm. Such layers have an effective dielectric constant ranging from 9 or 10 to 25. The expected $t_{eq}$ ranges for various effective dielectric constants are shown in the following:

| κ | Physical Thickness t = 0.5 nm (5 Å) $t_{eq}$ (Å) | Physical Thickness t = 1.0 nm (10 Å) $t_{eq}$ (Å) | Physical Thickness t = 5.0 nm (50 Å) $t_{eq}$ (Å) |
|---|---|---|---|
| 9 | 2.17 | 4.33 | 21.67 |
| 17 | 1.15 | 2.29 | 11.47 |
| 21 | .93 | 1.86 | 9.29 |
| 25 | .78 | 1.56 | 7.8 |

As mentioned, the lower limit on the scaling of a layer containing $HfO_2/ZrO_2$ nanolaminates depends on the monolayers of the film necessary to develop a full band gap such that good insulation is maintained between an underlying silicon layer and an overlying conductive layer to the $HfO_2/ZrO_2$ nanolaminate film. From above, it is apparent that a film containing $HfO_2/ZrO_2$ nanolaminates can be attained with a $t_{eq}$ ranging from 3 Å to 12 Å. Further, a dielectric film with completely formed band structures and monolayer formations can provide a $t_{eq}$ significantly less than 2 or 3 Å.

The novel process described above provides significant advantages by performing atomic layer deposition of $HfO_2/ZrO_2$ in a hafnium sequence using $HfI_4$ precursors followed by the formation of a $ZrO_2$ layer on the $HfO_2$ layer. Further, by independently controlling the various parameters for each sequence a gate dielectric with a selected dielectric constant can be formed. Additionally, the novel process can be implemented to form transistors, memory devices, and information handling devices. With careful preparation and engineering of the $HfO_2/ZrO_2$ nanolaminates limiting the size of interfacial regions, a $t_{eq}$ down to 2.5 Å or lower is anticipated.

A transistor 100 as depicted in FIG. 1 can be formed by forming a source/drain region 120 and another source/drain region 130 in a silicon based substrate 110 where the two source/drain regions 120, 130 are separated by a body region 132. The body region 132 separated by the source/drain 120 and the source/drain 130 defines a channel having a channel length 134. A dielectric film is formed on the substrate 110 by forming a layer of hafnium oxide on substrate 110 in a reaction chamber by atomic layer deposition using a $HfI_4$ precursor and forming a layer of zirconium oxide on the layer of hafnium oxide to form a $HfO_2/ZrO_2$ composite. The resulting $HfO_2/ZrO_2$ composite is a nanolaminate. These $HfO_2/ZrO_2$ nanolaminates can be formed using any of the various embodiments previously discussed. These $HfO_2/ZrO_2$ nanolaminates are contained in a dielectric film defining the gate dielectric 140.

A gate is formed over the gate dielectric 140. Typically, forming the gate includes forming a polysilicon layer, though a metal gate can be formed in an alternative process. Forming the substrate, source/region regions, and the gate is performed using standard processes known to those skilled in the art. Additionally, the sequencing of the various elements of the process for forming a transistor is conducted with standard fabrication processes, also as known to those skilled in the art.

Figure 11:
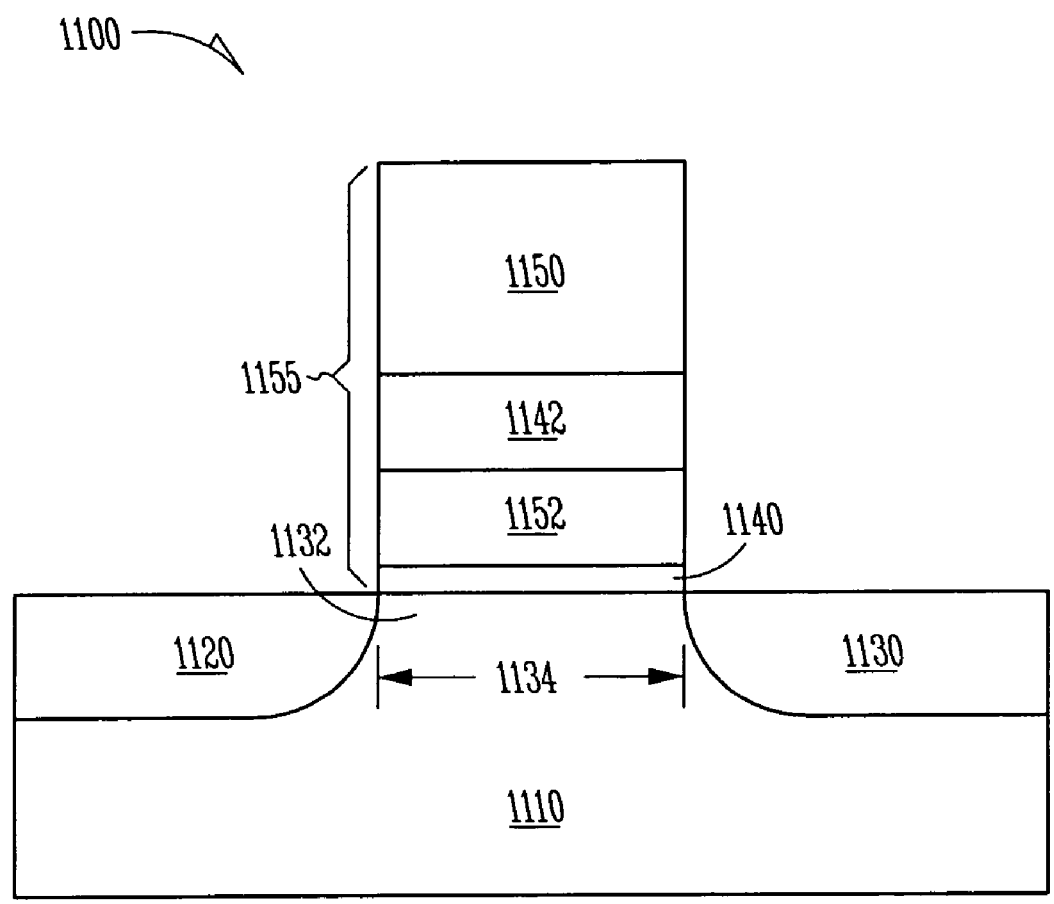
FIG. 11 shows an embodiment of a configuration of a transistor capable of being fabricated, according to the teachings of the present invention.

Embodiments of the method of forming $HfO_2/ZrO_2$ nanolaminates as a gate dielectric can be applied to other transistor structures having dielectric layers. For example, FIG. 11 shows an embodiment of a configuration of a transistor capable of being fabricated, according to the teachings of the present invention. The transistor 1100 includes a silicon based substrate 1110 with two source/drain regions 1120, 1130 separated by a body region 1132. The body region 1132 between the two source/drain regions 1120, 1130 defines a channel region having a channel length 1134. Located above the body region 1132 is a stack 1155 including a gate dielectric 1140, a floating gate 1152, a floating gate dielectric 1142, and control gate 1150. The gate dielectric 1140 containing $HfO_2/ZrO_2$ nanolaminates is formed according to the teachings of the present invention as described above with the remaining elements of the transistor 1100 formed using processes known to those skilled in the art. Alternately, both the gate dielectric 1140 and the floating gate dielectric 1142 can be formed containing $HfO_2/ZrO_2$ nanolaminates, in accordance with the present invention as described above.

Figure 12:
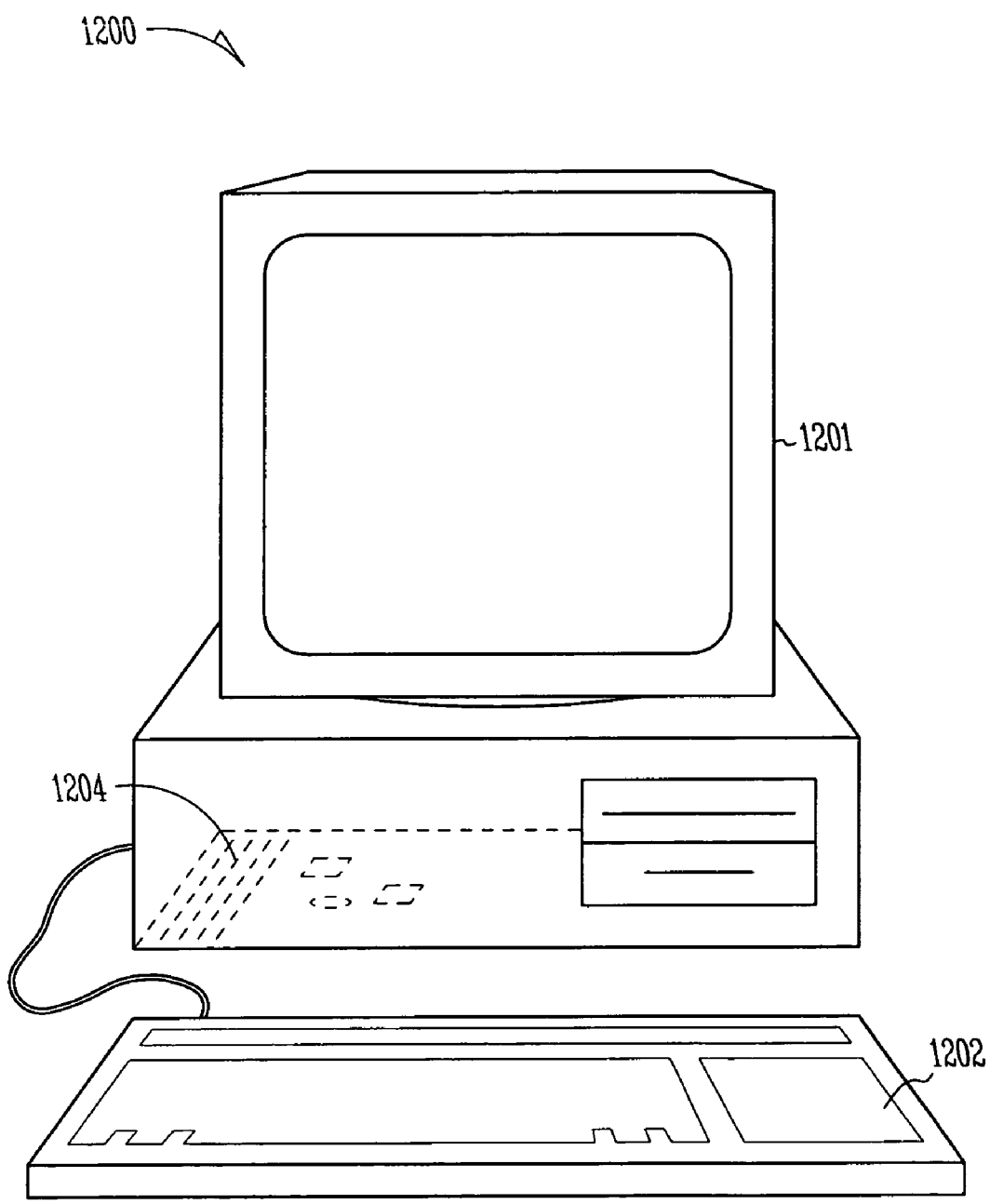
FIG. 12 shows an embodiment of a personal computer incorporating devices, according to the teachings of the present invention.
Figure 13:
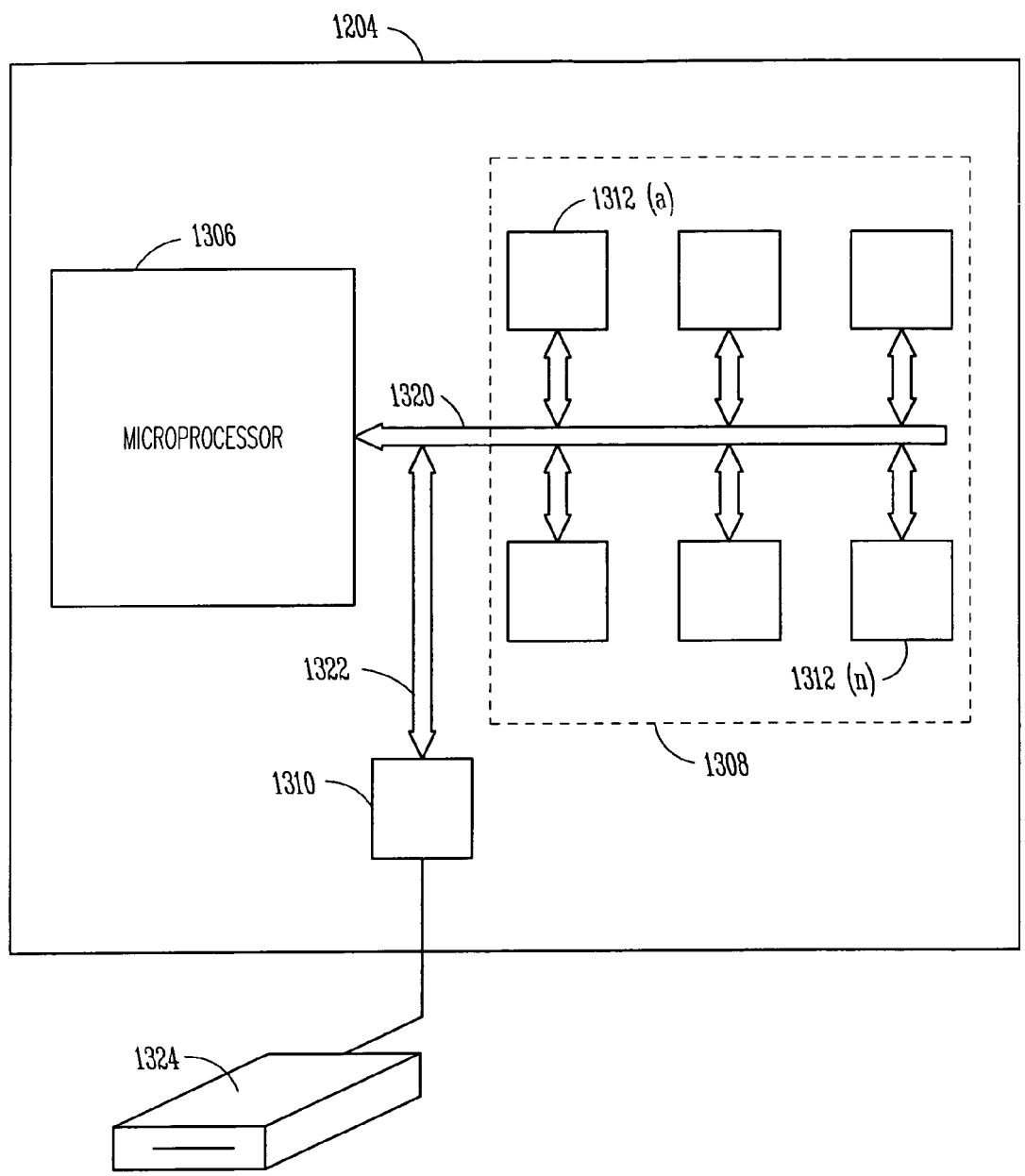
FIG. 13 illustrates a schematic view of an embodiment of a central processing unit incorporating devices, according to the teachings of the present invention.
Figure 14:
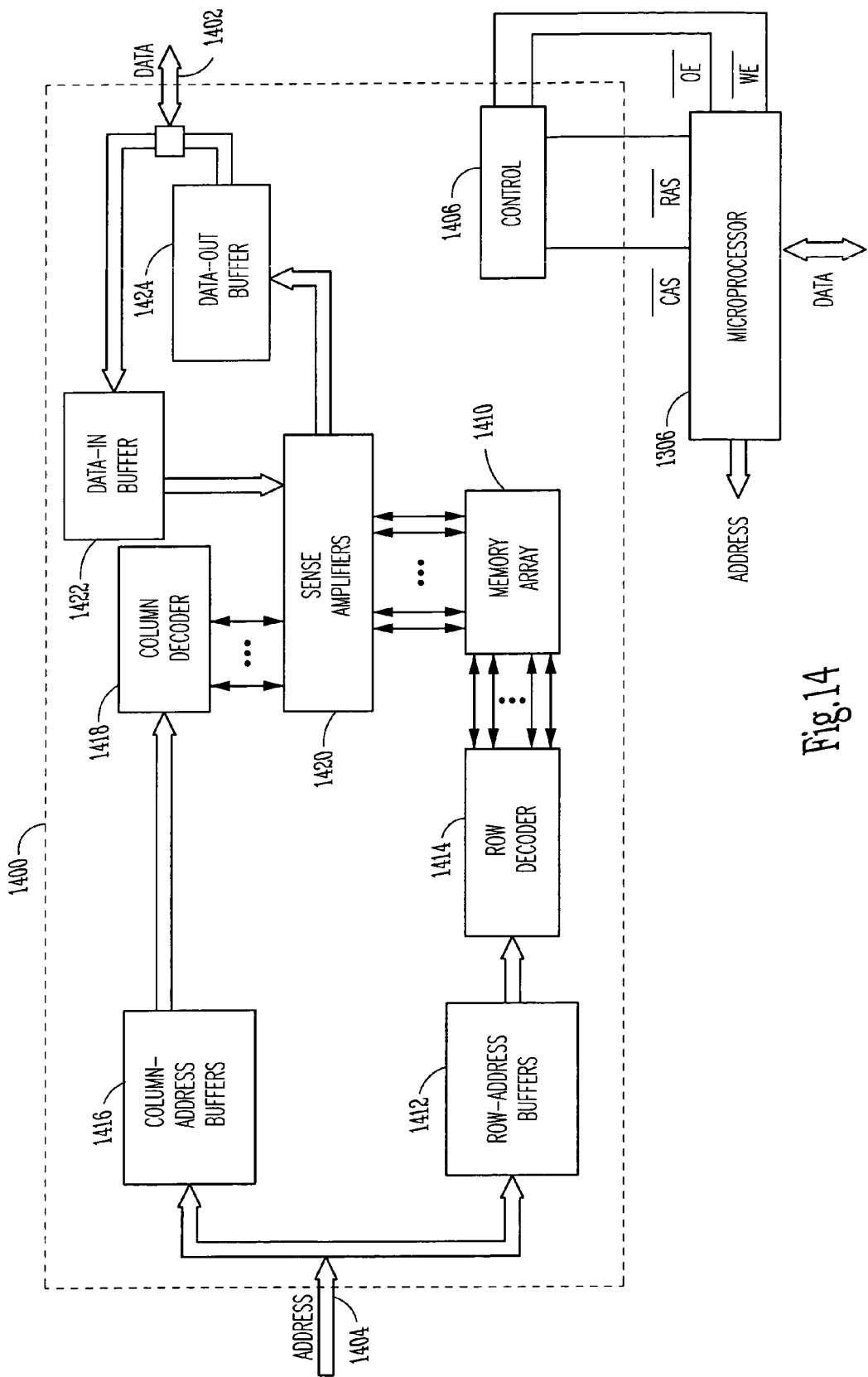
FIG. 14 illustrates a schematic view of an embodiment of a DRAM memory device, according to the teachings of the present invention.

Transistors created by the methods described above may be implemented into memory devices and electronic systems including information handling devices. Information handling devices having a dielectric layer containing $HfO_2/ZrO_2$ nanolaminates can be constructed using various embodiments of the methods described above. Such information devices can include wireless systems, telecommunication systems, and computers. An embodiment of a computer having a dielectric layer containing $HfO_2/ZrO_2$ nanolaminates is shown in FIGS. 12-14 and described below. While specific types of memory devices and computing devices are shown below, it will be recognized by one skilled in the art that several types of memory devices and electronic systems including information handling devices utilize the invention.

FIG. 12 shows an embodiment of a personal computer 1200 incorporating devices, according to the teachings of the present invention. Personal computer 1200 includes a monitor 1201, keyboard input 1202 and a central processing unit 1204.

FIG. 13 illustrates a schematic view of an embodiment of a central processing unit 1204 incorporating devices, according to the teachings of the present invention. The central processing unit 1204 typically includes microprocessor 1306, memory bus circuit 1308 having a plurality of memory slots 1312(a-n), and other peripheral circuitry 1310. Peripheral circuitry 1310 permits various peripheral devices 1324 to interface processor-memory bus 1320 over input/output (I/O) bus 1322. The personal computer 1200 shown in FIGS. 12 and 13 also includes at least one transistor having a gate dielectric containing $HfO_2/ZrO_2$ nanolarninates in an embodiment according to the teachings of the present invention.

Microprocessor 1306 produces control and address signals to control the exchange of data between memory bus circuit 1308 and microprocessor 1306 and between memory bus circuit 1308 and peripheral circuitry 1310. This exchange of data is accomplished over high speed memory bus 1320 and over high speed I/O bus 1322.

Coupled to memory bus 1320 are a plurality of memory slots 1312(a-n) which receive memory devices well known to those skilled in the art. For example, single in-line memory modules (SIMMs) and dual in-line memory modules (DIMMs) may be used in the implementation of the present invention.

These memory devices can be produced in a variety of designs which provide different methods of reading from and writing to the dynamic memory cells of memory slots 1312. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 1308.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 1320. Other alternative types of devices include SDRAM, DDR SDRAM, SLDRAM and Direct RDRAM as well as others such as SRAM or Flash memories.

FIG. 14 illustrates a schematic view of an embodiment of a DRAM memory device 1400 according to the teachings of the present invention. DRAM device 1400 is compatible with memory slots 1312(a-n). The description of DRAM 1400 has been simplified for purposes of illustrating a DRAM memory device and is not intended to be a complete description of all the features of a DRAM. Those skilled in the art will recognize that a wide variety of memory devices may be used in the implementation of the present invention. The example of a DRAM memory device shown in FIG. 14 includes at least one transistor having a gate dielectric containing $HfO_2/ZrO_2$ nanolaminates in an embodiment according to the teachings of the present invention.

Control, address and data information provided over memory bus 1320 is further represented by individual inputs to DRAM 1400, as shown in FIG. 14. These individual representations are illustrated by data lines 1402, address lines 1404 and various discrete lines directed to control logic 1406.

As is well known in the art, DRAM 1400 includes memory array 1410 which in turn comprises rows and columns of addressable memory cells. Each memory cell in a row is coupled to a common word line. The word line is coupled to gates of individual transistors, where at least one transistor has a gate coupled to a gate dielectric containing $HfO_2/ZrO_2$ nanolaminates in accordance with the method and structure previously described above. Additionally, each memory cell in a column is coupled to a common bit line. Each cell in memory array 1410 includes a storage capacitor and an access transistor as is conventional in the art.

DRAM 1400 interfaces with, for example, microprocessor 1306 through address lines 1404 and data lines 1402. Alternatively, DRAM 1400 may interface with a DRAM controller, a micro-controller, a chip set or other electronic system. Microprocessor 1306 also provides a number of control signals to DRAM 1400, including but not limited to, row and column address strobe signals RAS and CAS, write enable signal WE, an output enable signal OE and other conventional control signals.

Row address buffer 1412 and row decoder 1414 receive and decode row addresses from row address signals provided on address lines 1404 by microprocessor 1306. Each unique row address corresponds to a row of cells in memory array 1410. Row decoder 1414 includes a word line driver, an address decoder tree, and circuitry which translates a given row address received from row address buffers 1412 and selectively activates the appropriate word line of memory array 1410 via the word line drivers.

Column address buffer 1416 and column decoder 1418 receive and decode column address signals provided on address lines 1404. Column decoder 1418 also determines when a column is defective and the address of a replacement column. Column decoder 1418 is coupled to sense amplifiers 1420. Sense amplifiers 1420 are coupled to complementary pairs of bit lines of memory array 1410.

Sense amplifiers 1420 are coupled to data-in buffers 1422 and data-out buffers 1424. Data-in buffers 1422 and data-out buffers 1424 are coupled to data lines 1402. During a write operation, data lines 1402 provide data to data-in buffers 1422. Sense amplifier 1420 receives data from data-in buffers 1422 and stores the data in memory array 1410 as a charge on a capacitor of a cell at an address specified on address lines 1404.

During a read operation, DRAM 1400 transfers data to microprocessor 1306 from memory array 1410. Complementary bit lines for the accessed cell are equilibrated during a precharge operation to a reference voltage provided by an equilibration circuit and a reference voltage supply. The charge stored in the accessed cell is then shared with the associated bit lines. A sense amplifier of sense amplifiers 1420 detects and amplifies a difference in voltage between the complementary bit lines. The sense amplifier passes the amplified voltage to data-out buffers 1424.

Control logic 1406 is used to control the many available functions of DRAM 1400. In addition, various control circuits and signals not detailed herein initiate and synchronize DRAM 1400 operation as known to those skilled in the art. As stated above, the description of DRAM 1400 has been simplified for purposes of illustrating the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

CONCLUSION

A gate dielectric containing $HfO_2/ZrO_2$ nanolaminates and a method of fabricating such a gate produces a reliable gate dielectric having an equivalent oxide thickness thinner than attainable using $SiO_2$. Gate dielectrics containing $HfO_2/ZrO_2$ nanolaminates formed using the methods described herein are thermodynamically stable such that the gate dielectrics formed will have minimal reactions with a silicon substrate or other structures during processing.

Transistors, higher level ICs or devices, and systems are constructed utilizing the novel process for forming a gate dielectric having an ultra thin equivalent oxide thickness, $t_{eq}$. Gate dielectric layers or films containing $HfO_2/ZrO_2$ nanolaminates are formed having a high dielectric constant ($\kappa$), where the gate dielectrics are capable of a $t_{eq}$ thinner than 10 Å, thinner than the expected limit for $SiO_2$ gate dielectrics. At the same time, the physical thickness of the $HfO_2/ZrO_2$ nanolaminates is much larger than the $SiO_2$ thickness associated with the $t_{eq}$ limit of $SiO_2$. Forming the larger thickness provides advantages in processing the gate dielectric. Further, $HfO_2/ZrO_2$ nanolaminates processed in relatively low temperatures can provide amorphous dielectric films having relatively low leakage current for use as dielectric layers in electronic devices and systems.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. An electronic device comprising:
    a semiconductor substrate;
    a dielectric film disposed on the semiconductor substrate, the dielectric film containing a nanolaminate, the nanolaminate having an initial layer, the nanolaminate including:
        a plurality of layers of hafnium oxide, each layer of hafnium oxide essentially consisting of hafnium and oxygen, one of the layers of hafnium oxide being the initial layer;
        a plurality of layers of zirconium oxide, each layer of zirconium oxide essentially consisting of zirconium and oxygen, wherein between each of the layers of zirconium oxide one of the layers of the plurality of layers of hafnium oxide is disposed; and
        a transition layer between one of the layers of hafnium oxide and one of the layers of zirconium oxide, the transition layer having a graded composition.

2. The electronic device of claim 1, wherein the dielectric film is configured essentially as the nanolaminate.

3. The electronic device of claim 1, wherein the semiconductor substrate includes a non-silicon substrate.

4. The electronic device of claim 1, wherein the dielectric film is structured essentially as the nanolaminate configured as a gate dielectric of a transistor.

5. The electronic device of claim 1, wherein the dielectric film is structured essentially as the nanolaminate configured in a memory device.

6. The electronic device of claim 1, wherein the electronic device has conductive connections to couple a signal from a device in an electronic system to a conductive layer disposed on and contacting the dielectric film.

7. A transistor comprising:
    a body region between a first source/drain region and a second source/drain region on a silicon substrate;
    a dielectric film containing a nanolaminate on the body region between the first and second source/drain regions, the nanolaminate having an initial layer, the nanolaminate including:
        a plurality of layers of hafnium oxide, each layer of hafnium oxide essentially consisting of hafnium and oxygen, one of the layers of hafnium oxide being the initial layer;
        a plurality of layers of zirconium oxide, each layer of zirconium oxide essentially consisting of zirconium and oxygen, wherein between each of the layers of zirconium oxide one of the layers of the plurality of layers of hafnium oxide is disposed; and
        a transition layer between one of the layers of hafnium oxide and one of the layers of zirconium oxide, the transition layer having a graded composition; and
    a gate coupled to the dielectric film.

8. The transistor of claim 7, wherein each layer of the nanolaminate is formed by atomic layer deposition.

9. The transistor of claim 7, wherein the nanolaminate includes a final layer opposite the body region, the final layer being one of the plurality of hafnium oxide layers.

10. The transistor of claim 7, wherein the dielectric film has a dielectric constant in the range from about 10 to about 25.

11. The transistor of claim 7, wherein the gate is a control gate of the transistor.

12. A transistor comprising:
    a body region between a first source/drain region and a second source/drain region on a semiconductor substrate;
    a dielectric film containing a nanolaminate disposed on the body region between the first source/drain region and second source/drain region, the nanolaminate having an initial layer, the nanolaminate including:
        a plurality of layers of hafnium oxide, each layer of hafnium oxide essentially consisting of hafnium and oxygen, one of the layers of hafnium oxide being the initial layer;
        a plurality of layers of zirconium oxide, each layer of zirconium oxide essentially consisting of zirconium and oxygen, wherein between each of the layers of zirconium oxide one of the layers of the plurality of layers of hafnium oxide is disposed; and
        a transition layer between one of the layers of hafnium oxide and one of the layers of zirconium oxide, the transition layer having a graded composition; and
    a floating gate coupled to the dielectric film; and
    a control gate separated from the floating gate by an insulator.

13. The transistor of claim 12, wherein semiconductor substrate includes a silicon-on-sapphire substrate.

14. The transistor of claim 12, wherein the dielectric film is substantially amorphous.

15. The transistor of claim 12, wherein the dielectric film exhibits a dielectric constant in the range from about 9 to about 25.

16. The transistor of claim 12, wherein the dielectric film exhibits an equivalent oxide thickness ($t_{eq}$) in the range from about 3 Angstroms to about 12 Angstroms.

17. The transistor of claim 12, wherein the dielectric film exhibits an equivalent oxide thickness ($t_{eq}$) of less than 3 Angstroms.

18. A memory comprising:
a number of access transistors, at least one access transistor including a gate coupled to a dielectric film containing a nanolaminate, the dielectric film formed on a body region between a first source/drain region and a second source/drain region on a silicon substrate, the nanolaminate having an initial layer, the nanolaminate including:
   a plurality of layers of hafnium oxide, each layer of hafnium oxide essentially consisting of hafnium and oxygen, one of the layers of hafnium oxide being the initial layer;
   a plurality of layers of zirconium oxide, each layer of zirconium oxide essentially consisting of zirconium and oxygen, wherein between each of the layers of zirconium oxide one of the layers of the plurality of layers of hafnium oxide is disposed; and
   a transition layer between one of the layers of hafnium oxide and one of the layers of zirconium oxide, the transition layer having a graded composition;
a number of word lines coupled to a number of the gates of the number of access transistors;
a number of source lines coupled to a number of the first source/drain regions of the number of access transistors; and
a number of bit lines coupled to a number of the second source/drain regions of the number of access transistors;
the dielectric film containing the nanolaminate formed by a method including:
   forming a layer of hafnium oxide on a substrate in a reaction chamber by atomic layer deposition using a $HfI_4$ precursor; and
   forming a layer of zirconium oxide on the layer of hafnium oxide.

19. The memory of claim 18, wherein forming a layer of zirconium oxide includes forming a layer of zirconium oxide by atomic layer deposition.

20. The memory of claim 19, wherein forming a layer of zirconium oxide by atomic layer deposition includes using a $ZrI_4$ precursor.

21. The memory of claim 18, wherein the nanolaminate is substantially amorphous.

22. The memory of claim 18, wherein the nanolaminate has an equivalent oxide thickness ($t_{eq}$) less than 3 Angstroms.

23. A memory comprising:
a memory array having a number of access transistors, at least one access transistor including a gate coupled to a dielectric film, the dielectric film disposed on a body region between a first source/drain region and a second source/drain region on a semiconductor substrate, the dielectric film including a nanolaminate, the nanolaminate having an initial layer, the nanolaminate including:
   a plurality of layers of hafnium oxide, each layer of hafnium oxide essentially consisting of hafnium and oxygen, one of the layers of hafnium oxide being the initial layer;
   a plurality of layers of zirconium oxide, each layer of zirconium oxide essentially consisting of zirconium and oxygen, wherein between each of the layers of zirconium oxide one of the layers of the plurality of layers of hafnium oxide is disposed; and
   a transition layer between one of the layers of hafnium oxide and one of the layers of zirconium oxide, the transition layer having a graded composition.

24. The memory of claim 23, wherein the dielectric film has a dielectric constant in the range from about 9 to about 25.

25. The memory of claim 23, wherein the dielectric film has an equivalent oxide thickness ($t_{eq}$) in the range from about 3 Angstroms to about 12 Angstroms.

26. An electronic system comprising:
a processor;
a memory, the memory including:
   a number of access transistors, at least one access transistor having a gate coupled to a dielectric film containing a nanolaminate, the dielectric film containing the nanolaminate formed on a body region between a first source/drain region and a second source/drain region on a silicon substrate, the nanolaminate having an initial layer, the nanolaminate including:
      a plurality of layers of hafnium oxide, each layer of hafnium oxide essentially consisting of hafnium and oxygen, one of the layers of hafnium oxide being the initial layer;
      a plurality of layers of zirconium oxide, each layer of zirconium oxide essentially consisting of zirconium and oxygen, wherein between each of the layers of zirconium oxide one of the layers of the plurality of layers of hafnium oxide is disposed; and
      a transition layer between one of the layers of hafnium oxide and one of the layers of zirconium oxide, the transition layer having a graded composition; and
   a number of word lines coupled to a number of the gates of the number of access transistors;
   a number of source lines coupled to a number of the first source/drain regions of the number of access transistors;
   a number of bit lines coupled to a number of the second source/drain regions of the number of access transistors; and
a system bus that couples the processor to the memory;
the dielectric film containing the nanolaminate formed by a method including:
   forming a layer of hafnium oxide on a substrate in a reaction chamber by atomic layer deposition using a $HfI_4$ precursor; and
   forming a layer of zirconium oxide on the layer of hafnium oxide.

27. The electronic system of claim 26, wherein forming a layer of zirconium oxide includes forming a layer of zirconium oxide by atomic layer deposition.

28. The electronic system of claim 26, wherein the dielectric layer is substantially amorphous.

29. An electronic system comprising:
a processor; and
a memory, the memory including:
   a number of access transistors, at least one access transistor having a gate coupled to a dielectric film containing a nanolaminate, the film disposed on a body region between a first source/drain region and a second source/drain region on a semiconductor substrate, the nanolaminate having an initial layer, the nanolaminate including:
      a plurality of layers of hafnium oxide, each layer of hafnium oxide essentially consisting of hafnium and oxygen, one of the layers of hafnium oxide being the initial layer;

a plurality of layers of zirconium oxide, each layer of zirconium oxide essentially consisting of zirconium and oxygen, wherein between each of the layers of zirconium oxide one of the layers of the plurality of layers of hafnium oxide is disposed; and a transition layer between one of the layers of hafnium oxide and one of the layers of zirconium oxide, the transition layer having a graded composition; and a system bus that couples the processor to the memory.

30. The electronic system of claim 29, wherein the electronic system includes an information handling device.

31. The electronic system of claim 29, wherein the electronic system includes a wireless system.

32. The electronic system of claim 29, wherein the dielectric film has a dielectric constant in the range from about 9 to about 25.

33. The electronic system of claim 29, wherein the dielectric film exhibits an equivalent oxide thickness ($t_{eq}$) in the range from about 3 Angstroms to about 12 Angstroms.

* * * * *